United States Patent
Chae et al.

(10) Patent No.: US 10,270,008 B2
(45) Date of Patent: Apr. 23, 2019

(54) LIGHT EMITTING ELEMENT INCLUDING METAL BULK

(71) Applicant: SEOUL VIOSYS CO., LTD., Ansan-si (KR)

(72) Inventors: Jong Hyeon Chae, Ansan-si (KR); Chang Yeon Kim, Ansan-si (KR); Joon Sup Lee, Ansan-si (KR); Dae Woong Suh, Ansan-si (KR); Won Young Roh, Ansan-si (KR); Ju Yong Park, Ansan-si (KR); Seung Hyun Kim, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 15/558,143

(22) PCT Filed: Mar. 8, 2016

(86) PCT No.: PCT/KR2016/002296
§ 371 (c)(1),
(2) Date: Sep. 13, 2017

(87) PCT Pub. No.: WO2016/148424
PCT Pub. Date: Sep. 22, 2016

(65) Prior Publication Data
US 2018/0076360 A1    Mar. 15, 2018

(30) Foreign Application Priority Data

Mar. 16, 2015  (KR) .................. 10-2015-0036126
Mar. 18, 2015  (KR) .................. 10-2015-0037667

(51) Int. Cl.
*H01L 33/38*    (2010.01)
*H01L 27/15*    (2006.01)
(Continued)

(52) U.S. Cl.
CPC ............ *H01L 33/382* (2013.01); *H01L 27/15* (2013.01); *H01L 33/387* (2013.01); *H01L 33/20* (2013.01); *H01L 33/405* (2013.01); *H01L 33/62* (2013.01)

(58) Field of Classification Search
CPC ..... H01L 33/382; H01L 33/20; H01L 33/406; H01L 33/62; H01L 27/15
See application file for complete search history.

(56) References Cited

U.S. PATENT DOCUMENTS 8,110,421 B2 *  2/2012  Sugizaki ................. H01L 33/44
                                                                257/98
8,350,285 B2 *  1/2013  Sugizaki ............. H01L 33/0095
                                                                257/98

(Continued)

FOREIGN PATENT DOCUMENTS

CN         1433578 A      7/2003
CN         103119735 A    5/2013

(Continued)

OTHER PUBLICATIONS

International Search Report in International Application No. PCT/KR2016/002296, dated May 27, 2016.

(Continued)

*Primary Examiner* — William Coleman
(74) *Attorney, Agent, or Firm* — Perkins Coie LLP

(57) ABSTRACT

A light emitting element according to an embodiment of the present invention comprises a first conductive-type semiconductor layer including a contact region on the lower surface thereof, a light emitting structure which includes a mesa including a second conductive-type semiconductor layer and an active layer, a second electrode, a first insulation layer, an electrode cover layer, a first electrode, a second insulation layer, and a support structure. In addition, the mesa may include a body part and a plurality of protrusion parts protruding from the body part, the contact region may be disposed between the protrusion parts, and a part of the contact region may overlap with a second metal bulk in the vertical direction. Accordingly, current spreading efficiency can be improved, and thus luminance efficiency can be more improved.

17 Claims, 29 Drawing Sheets (a)

(b)

(51) Int. Cl.
   *H01L 33/20* (2010.01)
   *H01L 33/40* (2010.01)
   *H01L 33/62* (2010.01)

(56) References Cited

U.S. PATENT DOCUMENTS

| | | | | |
|---|---|---|---|---|
| 8,916,898 | B2 * | 12/2014 | Suh | H01L 33/44 |
| | | | | 257/98 |
| 9,048,409 | B2 * | 6/2015 | Seo | H01L 27/153 |
| 9,608,168 | B2 * | 3/2017 | Chae | H01L 33/405 |
| 9,634,186 | B2 * | 4/2017 | Lee | H01L 33/22 |
| 9,705,041 | B2 * | 7/2017 | Im | H01L 33/382 |

FOREIGN PATENT DOCUMENTS

| | | | |
|---|---|---|---|
| JP | 2014-508426 A | 4/2014 | |
| JP | 2015-032621 A | 2/2015 | |
| KR | 10-2013-0080686 A | 7/2013 | |
| KR | 10-2014-0009624 A | 1/2014 | |
| KR | 10-2014-0020190 A | 2/2014 | |

OTHER PUBLICATIONS

English Translation of Chinese Office Action for corresponding Chinese Patent Application No. 201680011635.9, dated Oct. 8, 2018 (11 pages).

\* cited by examiner (a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

LIGHT EMITTING ELEMENT INCLUDING METAL BULK

PRIORITY CLAIMS AND CROSS-REFERENCE TO RELATED APPLICATION

This patent document claims priority to and the benefit of Korean Patent Application No. 10-2015-0036126, filed on Mar. 16, 2015, Korean Patent Application No. 10-2015-0037667, filed on Mar. 18, 2015, and Korean Patent Application No. PCT/KR2016/002296 filed on Mar. 8, 2016, which are incorporated herein by reference for all purposes as if fully set forth herein.

TECHNICAL FIELD

Exemplary embodiments of the present disclosure relate to a light emitting element, and more particularly, to a light emitting element having improved luminous efficacy.

BACKGROUND

Recently, with increasing demand for small, high power light emitting elements, there is increasing need for a large flip chip type light emitting element having good heat dissipation efficiency. A flip chip type light emitting element includes an electrode directly bonded to a secondary substrate and does not employ a wire for supplying external power to the flip chip type light emitting element, thereby providing much better heat dissipation efficiency than a horizontal light emitting element. Therefore, the flip chip type light emitting element allows effective heat transfer towards the secondary substrate upon application of high density current thereto and thus can be suitably used as a high power light source.

Furthermore, in order to achieve size reduction and high output of a light emitting element, there is increasing need for a chip scale package that uses a light emitting element as a package by omitting a process of packaging the light emitting element in a separate housing. Particularly, since the electrode of the flip chip type light emitting element can act as a lead of the package, the flip chip type emitting device can be advantageously applied to such a chip scale package.

A chip scale package structure is more vulnerable to heat generated during high current driving. Thus, in order to improve reliability of a light emitting element through efficient heat dissipation, an external electrode such as a metal bulk is used and a certain region of the light emitting element must be secured by the external electrode.

On the other hand, the light emitting element emits light upon receiving power through an electrode electrically connected to a semiconductor layer. If a contact region between the semiconductor layer and the electrode is not sufficient and is present only in a certain region of the light emitting element, the light emitting element allows strong light emission at a certain location of the semiconductor layer due to insufficient spreading of electric current applied from an external power source. Specifically, since electric current flows to the semiconductor layer only through a certain contact region between the semiconductor layer and the electrode when supplied through the metal bulk, light emission is not efficiently performed in other regions of the semiconductor layer at which the electrode does not contact the semiconductor layer. Therefore, the light emitting element suffers from deterioration in luminous efficacy.

Generally, when a substrate is removed from the light emitting element, stress and strain occur on the light emitting element. The stress and strain are transferred to a light emitting structure, generating cracks in the light emitting structure. To solve this problem, although a thick metal pad or a polymer such as EMC is disposed under the light emitting structure, this structure also has a problem in that cracks are generated mainly at the center of the light emitting structure near an upper side of the polymer.

Therefore, there is a need for a light emitting element that can secure efficient heat dissipation and has good mechanical properties and improved current spreading efficiency.

SUMMARY

Exemplary embodiments of the present disclosure provide a light emitting element that has improved current spreading efficiency and secures a sufficient light emission region to provide good luminous efficacy. In addition, exemplary embodiments of the present disclosure provide a light emitting element which secures reliability through efficient heat dissipation. Furthermore, exemplary embodiments of the present disclosure provide a light emitting element which can be prevented from being damaged due to stress and strain upon separation of a substrate therefrom.

In accordance with one aspect of the present disclosure, a light emitting element includes: a light emitting structure including a first conductivity type semiconductor layer including a contact region formed on a lower surface thereof, and a mesa including an active layer disposed on the lower surface of the first conductivity type semiconductor layer and a second conductivity type semiconductor layer disposed on a lower surface of the active layer; a second electrode disposed on a lower surface of the second conductivity type semiconductor layer and electrically connected to the second conductivity type semiconductor layer; a first insulation layer disposed on a lower surface and a side surface of the second electrode and including an opening exposing the contact region; an electrode cover layer disposed on a lower surface of the first insulation layer and adjoining the lower surface of the second electrode while being separated from the first electrode; a first electrode disposed on the lower surface of the first insulation layer and adjoining the contact region through the opening; a second insulation layer disposed on the lower surfaces of the first electrode and the electrode cover layer and including openings exposing the first electrode and the second electrode, respectively; and a support structure including a first metal bulk and a second metal bulk disposed on the lower surface and the side surface of the second insulation layer to be separated from each other and electrically connected to the first electrode and the second electrode through the openings, respectively, and an insulating portion disposed on a side surface of the first metal bulk and a side surface of the second metal bulk. The mesa may include a main body and a plurality of protrusions protruding from the main body, and the contact region may be disposed between the protrusions and partially overlap the second metal bulk in a upward-downward direction. With this structure, the light emitting element can prevent the contact region between the first electrode and the first conductivity type semiconductor layer from being excessively biased to one side thereof, thereby improving current spreading efficiency. Therefore, the light emitting element can have further improved luminous efficacy.

In accordance with another aspect of the present disclosure, a light emitting element includes: a light emitting structure including a first conductivity type semiconductor layer, a second conductivity type semiconductor layer disposed on a lower surface of the first conductivity type semiconductor layer, an active layer interposed between the first conductivity type semiconductor layer and the second conductivity type semiconductor layer, and a plurality of holes formed through the second conductivity type semiconductor layer and the active layer to expose the first conductivity type semiconductor layer; a first electrode disposed in each of the holes and electrically connected to the first conductivity type semiconductor layer; a second electrode insulated from the first electrode, the second electrode being disposed on a lower surface of the second conductivity type semiconductor layer and electrically connected to the second conductivity type semiconductor layer; an insulation layer disposed on a lower surface and a side surface of the first electrode and on a lower surface and a side surface of the second electrode, and having openings exposing the first electrode and the second electrode, respectively; and a support structure including a first metal bulk and a second metal bulk disposed on a lower surface and a side surface of the insulation layer to be separated from each other and electrically connected to the first electrode and the second electrode through the openings, respectively, and an insulating portion disposed on a side surface of the first metal bulk and a side surface of the second metal bulk. In addition, the holes may include a first hole. The first hole includes a first region, a second region, and a connection portion connecting the first region to the second region, in which the first region may be disposed on the first metal bulk and the second region may be disposed on the second metal bulk. With this structure, the light emitting element can have improved current spreading efficiency and can secure a sufficient light emitting region, thereby improving luminous efficacy.

According to exemplary embodiments, the light emitting element has a contact region extending in a longitudinal direction, thereby preventing the contact region between the first electrode and the first conductivity type semiconductor layer from being biased to one side thereof. As a result, the light emitting element has improved current spreading efficiency. In addition, a light emitting region of the light emitting element can be sufficiently secured by a single mesa structure surrounding the contact region. As a result, the light emitting element can have improved luminous efficacy. Furthermore, the light emitting element can secure efficient heat dissipation through a first metal bulk, a second metal bulk and an electrode cover layer. Furthermore, since the electrode cover layer is formed in a wide region, it is possible to prevent damage to the light emitting element due to stress and strain upon separation of a substrate from the light emitting element.

Furthermore, according to exemplary embodiments, since the first hole is present over the first metal bulk and the second metal bulk, electric current supplied through the first electrode can be efficiently spread in the light emitting element. Furthermore, the light emitting element can have a sufficient light emitting region, thereby improving luminous efficacy.

DETAILED DESCRIPTION

Figure 1:
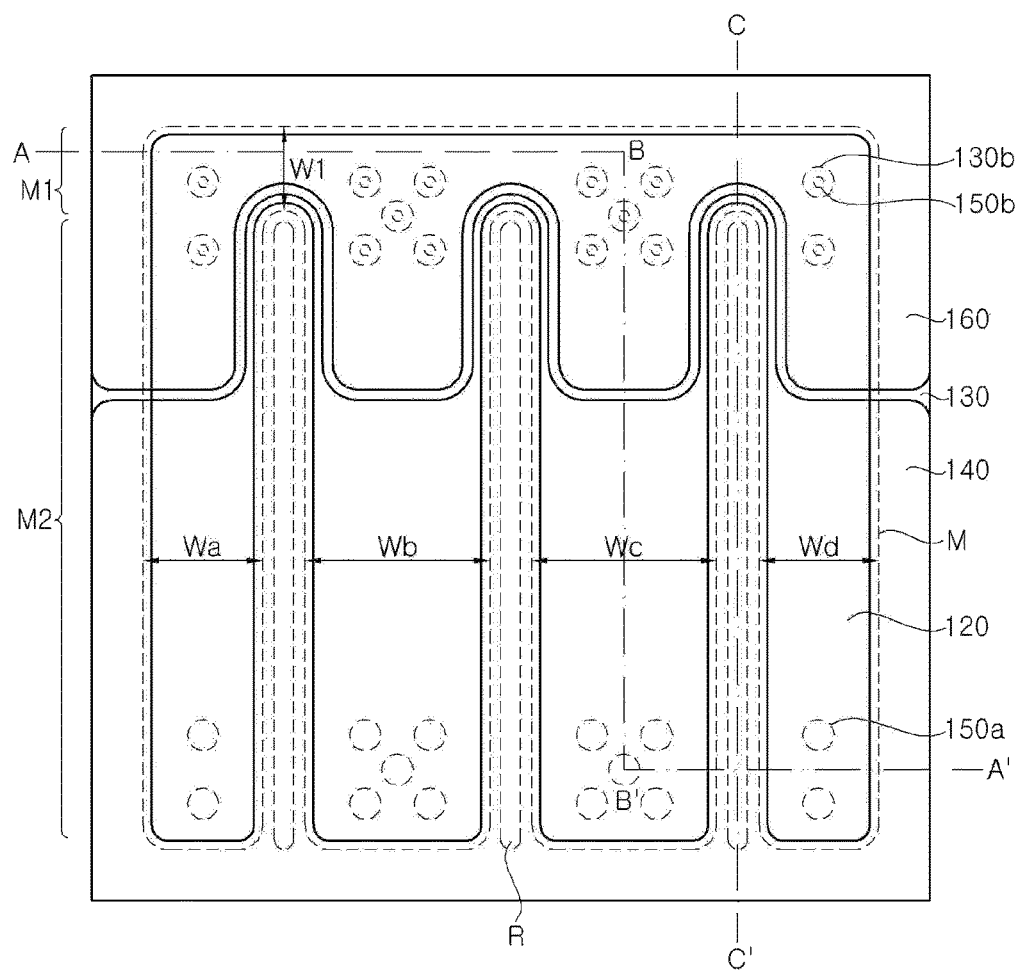
FIG. 1 and FIG. 2 are plan views of a light emitting element according to one exemplary embodiment of the present disclosure.

Light emitting elements according to exemplary embodiments may be realized in various ways.

A light emitting element according to exemplary embodiments includes: a light emitting structure including a first conductivity type semiconductor layer including a contact region formed on a lower surface thereof, and a mesa including an active layer disposed on the lower surface of the first conductivity type semiconductor layer and a second conductivity type semiconductor layer disposed on a lower surface of the active layer; a second electrode disposed on a lower surface of the second conductivity type semiconductor layer and electrically connected to the second conductivity type semiconductor layer; a first insulation layer disposed on a lower surface and a side surface of the second electrode and including an opening exposing the contact region; an electrode cover layer disposed on a lower surface of the first insulation layer and adjoining the lower surface of the second electrode while being separated from the first electrode; a first electrode disposed on the lower surface of the first insulation layer and adjoining the contact region through the opening; a second insulation layer disposed on the lower surfaces of the first electrode and the electrode cover layer and including openings exposing the first electrode and the second electrode, respectively; and a support structure including a first metal bulk and a second metal bulk disposed on the lower surface and the side surface of the second insulation layer to be separated from each other and electrically connected to the first electrode and the second electrode through the openings, respectively, and an insulating portion disposed on a side surface of the first metal bulk and a side surface of the second metal bulk. The mesa may include a main body and a plurality of protrusions protruding from the main body, the contact region may be disposed between the protrusions, and part of the contact region may overlap the second metal bulk in a upward-downward direction. With this structure, the light emitting element can prevent the contact region between the first electrode and the first conductivity type semiconductor layer from being excessively biased to one side thereof, thereby improving current spreading efficiency. Therefore, the light emitting element can have further improved luminous efficacy.

Among the plurality of protrusions, protrusions disposed between two contact regions may have greater widths in a short axis direction than other protrusions disposed between a side surface of the light emitting element and one contact region. With this structure, the light emitting element has higher current spreading efficiency and further improved luminous efficacy.

The main body may have a width of 87 μm to 90 μm in the short axis direction. Within this range of width, the light emitting element can secure a sufficient light emitting region therein. Further, since the contact regions extend towards the main body to improve current spreading efficiency, the light emitting element can have improved luminous efficacy.

The second insulation layer may be partially disposed between the second metal bulk and the first electrode and insulate the first electrode from the second metal bulk. Accordingly, short circuit between the electrode cover layer and the first electrode can be effectively prevented.

One side of the electrode cover layer may be disposed along one side of the light emitting element, the other side of the electrode cover layer opposite the one side of the electrode cover layer may face one side of the first electrode, and a portion of the electrode cover layer may be disposed on a side surface of the mesa. With this structure, the light emitting element allows heat generated from the light emitting structure to be easily discharged through the second electrode and the electrode cover layer. Furthermore, the light emitting element can more effectively block intrusion of external contaminants through side surfaces thereof. Furthermore, the light emitting element can effectively prevent the insulating portion from peeling off of the metal bulks due to stress and strain generated upon separation of a substrate.

The electrode cover layer does not overlap the contact region and the first electrode in the upward-downward direction, and a side surface of the electrode cover layer may include an indented portion and a protruded portion formed to surround a portion of the contact region. Accordingly, the contact region and a portion of the first electrode adjoining the contact region may be formed in an elongated shape so as to be adjacent to the main body of the mesa. This structure can improve current spreading efficiency of the light emitting element, thereby improving luminous efficacy.

A portion of the second insulation layer may be disposed in a separation space between the electrode cover layer and the first electrode, wherein the separation space does not overlap the contact region in the upward-downward direction.

The light emitting element may further include a first pad and a second pad disposed on lower surfaces of the first and second metal bulks, respectively, wherein a distance between the first pad and the second pad may be greater than the distance between the first metal bulk and the second metal bulk. This structure can effectively prevent short circuit between the first pad and the second pad by an adhesive material, thereby improving stability of the light emitting element.

The light emitting element may further include an insulating layer disposed on an upper or side surface of the light emitting structure. The insulating layer can serve to protect the light emitting structure from external contaminants or impact. Therefore, the light emitting element can have improved stability.

A light emitting element according to other exemplary embodiments includes: a light emitting structure including a first conductivity type semiconductor layer, a second conductivity type semiconductor layer disposed on a lower surface of the first conductivity type semiconductor layer, an active layer interposed between the first conductivity type semiconductor layer and the second conductivity type semiconductor layer, and a plurality of holes formed through the second conductivity type semiconductor layer and the active layer to expose the first conductivity type semiconductor layer; a first electrode disposed in each of the holes and electrically connected to the first conductivity type semiconductor layer; a second electrode insulated from the first electrode, the second electrode being disposed on a lower surface of the second conductivity type semiconductor layer and electrically connected to the second conductivity type semiconductor layer; an insulation layer disposed on a lower surface and a side surface of the first electrode and on a lower surface and a side surface of the second electrode, and having openings exposing the first electrode and the second electrode, respectively; and a support structure including a first metal bulk and a second metal bulk disposed on a lower surface and a side surface of the insulation layer to be separated from each other and electrically connected to the first electrode and the second electrode through the openings, respectively, and an insulating portion disposed on a side surface of the first metal bulk and a side surface of the second metal bulk. In addition, the holes may include a first hole. The first hole includes a first region, a second region, and a connection portion connecting the first region to the second region, in which the first region may be disposed on the first metal bulk and the second region may be disposed on the second metal bulk. With this structure, the light emitting element can have improved current spreading efficiency and can secure a sufficient light emitting region, thereby improving luminous efficacy.

The first electrode may be separated from a side surface of the hole and may be formed corresponding to a shape of the hole. With this structure, the first electrode can be insulated from the second conductivity type semiconductor layer and the active layer and can secure a sufficient light emitting region to improve current spreading efficiency.

The first electrode may be separated from the side surface of the hole by a constant distance.

The first region may be larger than the second region. In this structure, a portion of the first electrode disposed in the first region has a relatively small area, thereby preventing excessive decrease in area of the light emitting region. Further, upon separation of the substrate, stress and strain applied to the light emitting structure are relieved by a metallic material disposed under the first region and having a sufficient width and thickness, thereby preventing the light emitting structure from cracking.

The first and second regions may have a circular shape. With this structure, since stress and strain generated upon separation of a substrate can be uniformly distributed through the first and second portions, damage to the light emitting element can be reduced.

The holes may further include at least one second hole disposed on the first metal bulk. With this structure, the light emitting element can secure a sufficient contact region between the first electrode and the first conductivity type semiconductor layer, thereby improving current spreading efficiency.

A distance between the second hole and the second metal bulk may be larger than the distance between the first region and the second metal bulk. With this structure, the light emitting element can secure a sufficient light emitting region while improving efficiency in spreading of electric current supplied through the first metal bulk.

The second hole may have a circular shape. Since stress and strain generated upon separation of a substrate can be uniformly distributed around the first electrode in the second hole, damage to the light emitting element can be reduced.

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element is referred to as being "disposed above" or "disposed on" another element, it can be directly "disposed above" or "disposed on" the other element, or intervening elements can be present. Throughout the specification, like reference numerals denote like elements having the same or similar functions.

Figure 2:
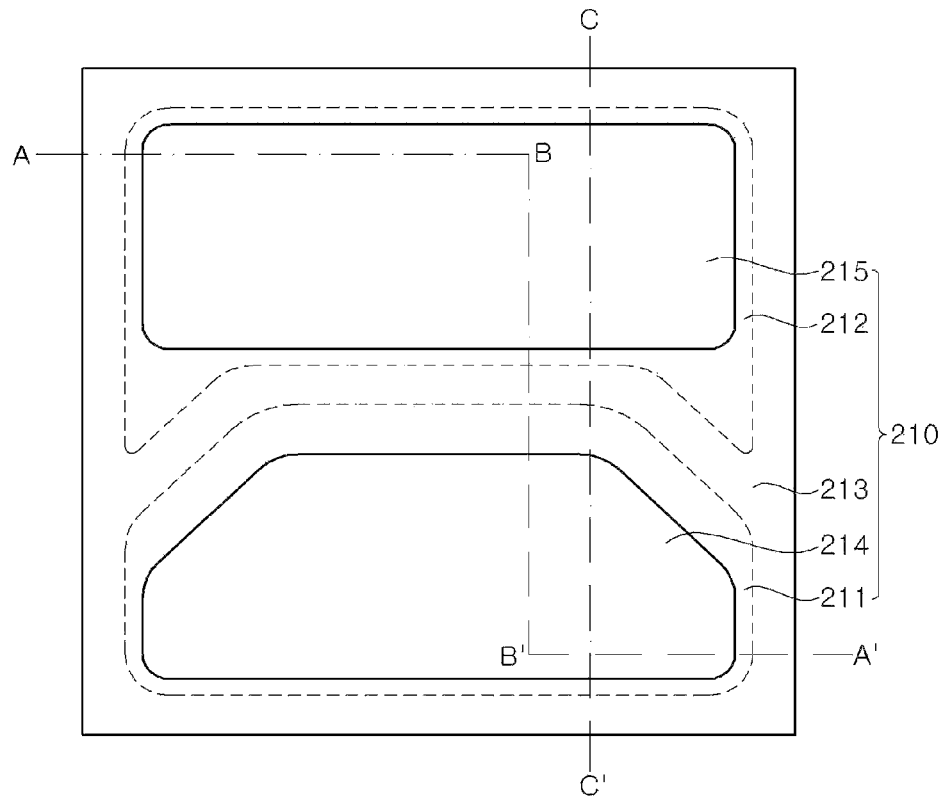
Figure 3:
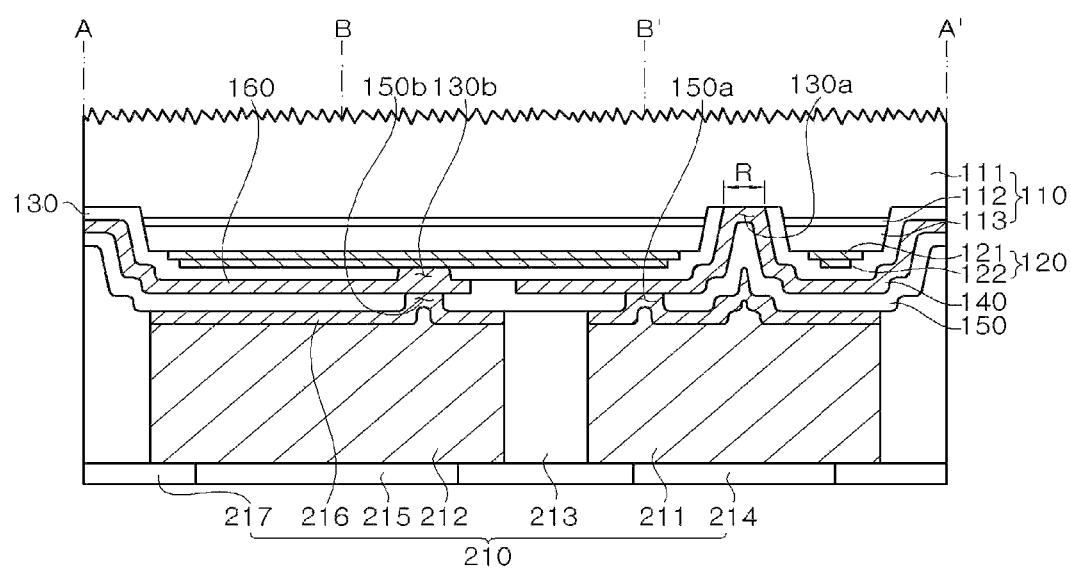
FIG. 3 and FIG. 4 are cross-sectional views of the light emitting element according to the exemplary embodiment of the present disclosure.
Figure 4:
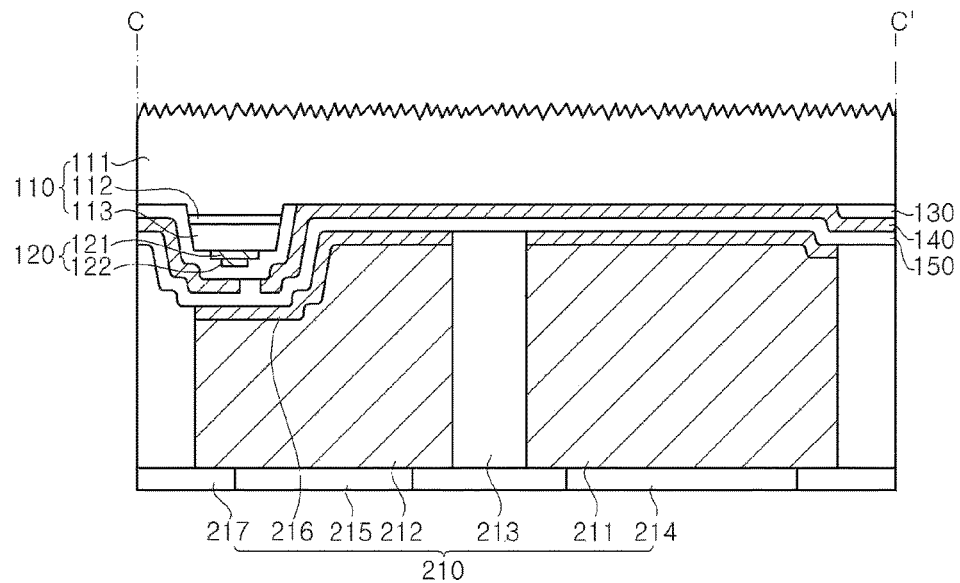

FIG. 1 to FIG. 4 are plan views and cross-sectional views of a light emitting element according to one exemplary embodiment of the present disclosure. FIG. 1 is a top plan view of the light emitting element, from which a support structure 210 is omitted for description of the light emitting element, and FIG. 2 is a bottom plan view of the light emitting element. FIG. 3 is a cross-sectional view taken along line A-B-B'-A' of FIG. 1. FIG. 4 is a cross-sectional view taken along line C-C' of FIG. 1.

Referring to FIG. 1 to FIG. 4, the light emitting element includes a light emitting structure 110, a second electrode 120, a first insulation layer 130, an electrode cover layer 160, a first electrode 140, a second insulation layer 150, and a support structure 210. The light emitting element may further include a growth substrate (not shown).

The light emitting structure 110 includes a first conductivity type semiconductor layer 111, an active layer 112 disposed on a lower surface of the first conductivity type semiconductor layer 111, and a second conductivity type semiconductor layer 113 disposed on a lower surface of the active layer 112. The first conductivity type semiconductor layer 111, the active layer 112 and the second conductivity type semiconductor layer 113 may include group III-V based compound semiconductors, for example, a nitride-based semiconductor such as (Al, Ga, In)N. The first conductivity type semiconductor layer 111 may include n-type dopants (for example, Si) and the second conductivity type semiconductor layer 113 may include p-type dopants (for example, Mg), or vice versa. The active layer 112 may include a multi-quantum well (MQW) structure and the composition ratio of the active layer may be determined so as to emit light having a predetermined peak wavelength.

The light emitting structure 110 may include a mesa M which includes the second conductivity type semiconductor layer 113 and the active layer 112. The mesa M may be formed by partially removing the second conductivity type semiconductor layer 113 and the active layer 112. The mesa M may have an inclined side surface. The inclined side surface of the mesa M improves efficiency in extraction of light generated in the active layer 112.

Referring to FIG. 1, the light emitting structure 110 may include a single mesa M. The mesa M may include a main body $M_1$ and a plurality of protrusions $M_2$. The main body $M_1$ may have a rectangular shape or a rounded rectangular shape having a long axis and a short axis, without being limited thereto. The plurality of protrusions $M_2$ may protrude from the main body $M_1$, particularly, from a side surface of the main body $M_1$. Each of the protrusions $M_2$ may have a long axis and a short axis. Although four protrusions $M_2$ are shown in FIG. 1, the mesa M may include more or less protrusions $M_2$ than the four protrusions $M_2$. The main body $M_1$ may have a width $W_1$ of about 87 μm to about 90 μm, preferably 90 μm, in the short axis direction. The short axis direction of the main body $M_1$ may be coincident with the long axis direction of the protrusions $M_2$, and the long axis direction of the main body M1 may be coincident with the short axis direction of the protrusions $M_2$.

The plural protrusions $M_2$ may have different widths Wa, Wb, Wc, Wd in the short axis direction thereof. Among the plurality of protrusions $M_2$, the widths Wb, Wc of protrusions disposed between two contact regions R may be larger than the widths Wa, Wd of protrusions disposed between a side surface of the light emitting element and one contact region R. The protrusions disposed between two contact regions R allow application of current through the two contact regions R, thereby providing a relatively large area in which current can be sufficiently spread. On the other hand, the protrusions disposed between the side surface the light emitting element and one contact region R allow application of current through the one contact region R, thereby providing a relatively narrow area in which current can be sufficiently spread. Accordingly, luminous efficacy of the light emitting element can be improved by adjusting the width of each of the protrusions $M_2$ in the short axis direction. For example, some protrusions $M_2$ may have widths Wb, We of 298 μm in the short axis direction and the other protrusions $M_2$ may have widths Wa, Wd of 164 μm in the short axis direction.

The mesa M may be surrounded by an exposed surface of the first conductivity type semiconductor layer 111 formed by partially removing the second conductivity type semiconductor layer 113 and the active layer 112. Referring to FIG. 1, the exposed surface of the first conductivity type semiconductor layer 111 may be disposed along indentations between the protrusions $M_2$ of the mesa M and along the outer periphery of the light emitting structure 110. However, it should be understood that other implementations are also possible. Alternatively, one side of each of the protrusions $M_2$ may extend to one side of the light emitting structure 110 such that exposed surfaces of the first conductivity type semiconductor layer 111 disposed between the protrusions $M_2$ can be separated from each other.

The first conductivity type semiconductor layer 111 may include the contact regions R on a lower surface thereof. The contact regions R may be disposed between the protrusions $M_2$ and may have an elongated shape extending in the long axis direction of the protrusions $M_2$. The contact regions R adjoin the first electrode 140 described below such that the first conductivity type semiconductor layer 111 can be electrically connected to the first electrode 140 therethrough.

The light emitting structure 110 may further include a roughened surface. The roughened surface may be formed by at least one of wet etching, dry etching, and electrochemical etching. For example, the roughened surface may be formed by PEC etching or by etching using an etching solution comprising KOH and NaOH. Accordingly, the light emitting structure 110 may include a convex portion and/or a concave portion having a micrometer to nanometer scale and formed on the surface of the first conductivity type semiconductor layer 111. The roughened surface can improve efficiency in extraction of light emitted from the light emitting structure 110.

The second electrode 120 may be disposed on a lower surface of the second conductivity type semiconductor layer 113 and electrically connected to the second conductivity type semiconductor layer 113. The second electrode 120 may cover at least part of the lower surface of the second conductivity type semiconductor layer 113 and may also be formed to cover the entirety of the lower surface thereof. Alternatively, the second electrode 120 may be formed to cover the lower surface of the second conductivity type semiconductor layer 113 in a region excluding a location at which the exposed surface of the first conductivity type semiconductor layer 111 of the light emitting structure 110 is formed. With this structure, the light emitting element allows current to be uniformly supplied to the overall region of the light emitting structure 110, thereby improving current spreading efficiency. However, it should be understood that other implementations are also possible. The second electrode 120 may include a plurality of unit electrodes.

The second electrode 120 may include a reflective metal layer 121 and may further include a barrier metal layer 122. The barrier metal layer 122 may cover at least part of a lower surface of the reflective metal layer 121. For example, the barrier metal layer 122 may be formed to cover the lower surface of the reflective metal layer 121 by forming the reflective metal layer 121 in a predetermined pattern, followed by forming the barrier metal layer 122 on the lower surface of the reflective metal layer 121. However, it should be understood that other implementations are also possible. Alternatively, the barrier metal layer 122 may be formed to cover the lower surface and a side surface of the reflective metal layer 121. For example, the reflective metal layer 121 may be formed by depositing Ag, Ag alloys, Ni/Ag layers, NiZn/Ag layers, or TiO/Ag layers, followed by patterning. On the other hand, the barrier metal layer 122 may be formed of Ni, Cr, Ti, Pt, W or combinations thereof and serves to prevent diffusion of metallic materials of the reflective metal layer 121 or contamination thereof. The second electrode 120 may include indium tin oxide (ITO). Since ITO is composed of metal oxides having high luminous transmittance, ITO can improve luminous efficacy by suppressing absorption of light by the second electrode 120.

The first insulation layer 130 may be disposed on a lower surface and a side surface of the second electrode 120. Referring to FIGS. 1, 3 and 4, the first insulation layer 130 covers the lower surface of the light emitting structure 110 and the lower and side surfaces of the second electrode 120, and may also be disposed between the light emitting structure 110 and the first electrode 140 to insulate the first electrode 140 from the second electrode 120. The first insulation layer 130 may include openings 130a, 130b in particular regions to allow electrical connection to the first conductivity type semiconductor layer 111 and the second conductivity type semiconductor layer 113 therethrough. For example, the first insulation layer 130 includes openings 130a that expose the first conductivity type semiconductor layer 111 and openings 130b that expose the second electrode 120. Specifically, the opening 130a may be formed to expose the contact region R and, in this case, the opening 130a may be formed corresponding to the shape of the contact region R.

The first insulation layer 130 may be formed of an oxide layer such as $SiO_2$, a nitride layer such as $SiN_x$, or an insulating layer such as $MgF_2$. Furthermore, the first insulation layer 130 may include a distributed Bragg reflector (DBR) in which low refractive index material layers and high refractive index material layers are alternately stacked one above another. For example, an insulation reflective layer having high reflectivity may be formed by stacking $SiO_2/TiO_2$ layers or $SiO_2/Nb_2O_5$ layers.

The electrode cover layer 160 may be disposed on the lower surface of the first insulation layer 130 and may adjoin the lower surface of the second electrode 120. The electrode cover layer 160 may adjoin the lower surface of the second electrode 120 through the openings 130b. This structure can reduce a step between first and second metal bulks described below. Further, the electrode cover layer 160 may be separated from the first electrode 140 via a separation space. Accordingly, the first electrode 140 can be insulated from the second electrode 120.

One side of the electrode cover layer 160 may be disposed along one side of the light emitting element. Specifically, one side of the electrode cover layer 160 may be disposed adjacent one side of light emitting element and the other side of the electrode cover layer 160 may be disposed to face one side of the first electrode 140. That is, the electrode cover layer 160 may be disposed on the lower surface of the first insulation layer 130 excluding a region in which the first electrode 140 is placed. With this structure, the light emitting element allows heat generated from the light emitting structure 110 to be easily discharged through the second electrode 120 and the electrode cover layer 160. A portion of the electrode cover layer 160 may be disposed on a side surface of the mesa M. With this structure, the light emitting element can more effectively block intrusion of external contaminants through the side surface thereof.

The separation space between the electrode cover layer 160 and the first electrode 140 does not overlap the contact region R in an upward-downward direction. Specifically, referring to FIG. 1, the entirety of the contact regions R is disposed above the first electrode 140 and is not disposed above the electrode cover layer 160. The electrode cover layer 160 does not overlap the contact regions R and the first electrode 140 in the upward-downward direction. In addition, a side surface of the electrode cover layer 160 may include an indented portion and a protruded portion formed to surround a portion of the contact region R. Specifically, a portion of one end of the contact region R may be surrounded by the indented portion of the electrode cover layer 160. Thus, the contact region R and a portion of the first electrode 140 adjoining the contact region R may be formed in an elongated shape to be adjacent to the main body $M_1$ of the mesa M. With this structure, the light emitting element can have improved luminous efficacy through improvement in current spreading efficiency.

The electrode cover layer 160 may be formed of a metallic material having conductivity. The electrode cover layer 160 may be formed of the same material as the first electrode 140 described below. Specifically, the first electrode 140 and the electrode cover layer 160 may be formed at the same time by the same process. Accordingly, the light emitting element according to the exemplary embodiments provides an advantage of simplification of the manufacturing process.

The first electrode 140 may be disposed on the lower surface of the first insulation layer 130. One side of the first electrode 140 may be disposed along one side of the light emitting element adjacent to distal ends of the protrusions $M_2$ under the lower surface of the first insulation layer 130, and the other side of the first electrode 140 may include a protruded portion and an indented portion. The protruded portion and the indented portion of the first electrode 140 engage with the indented portion and the protruded portion of the electrode cover layer 160, respectively, and are separated from each other via a separation space therebetween. The first electrode 140 may be electrically connected to the first conductivity type semiconductor layer 111. The first electrode 140 may be electrically connected to the first conductivity type semiconductor layer 111 while adjoining the contact regions R of the first conductivity type semiconductor layer 111 through the openings 130a. The first electrode 140 may cover the entirety of the contact regions R. The first electrode 140 may be insulated from the second electrode 120 by an insulation layer such as the first insulation layer 130 described below. The first electrode 140 may include a highly reflective metal layer, such as an Al layer, which may be formed on a bonding layer, such as a Ti, Cr or Ni layer. Further, a protective layer composed of a single layer or combination layer of Ni, Cr, Au, and the like may be formed on the highly reflective metal layer. The first electrode 140 may have a multilayer structure of, for example, Ti/Al/Ti/Ni/Au. The first electrode 140 may be formed by deposition of metallic materials, followed by patterning.

The second insulation layer 150 may be disposed on a lower surface of the first electrode 140 and a lower surface of the electrode cover layer 160. The second insulation layer 150 can more effectively prevent short circuit between the first electrode 140 and the second electrode 120 and can serve to protect the light emitting structure 110 from external contaminants or impact. The second insulation layer 150 may cover a portion of the first electrode 140. The second insulation layer 150 may include openings 150a that expose the first electrode 140 and openings 150b that allow electrical connection between the second electrode 120 and the second metal bulk 212 described below. Sidewalls of the first electrode 140 may be covered by the second insulation layer 150. A portion of the second insulation layer 150 may be placed in the separation space between the electrode cover layer 160 and the first electrode 140. Accordingly, short circuit between the electrode cover layer 160 and the first electrode 140 can be effectively prevented. The second insulation layer 150 may be disposed between the second metal bulk 212 and the first electrode 140 to insulate the first electrode 140 from the second metal bulk 212. The second insulation layer 150 may be formed by depositing an oxide insulation layer, a nitride insulation layer, or a polymer such as polyimide, Teflon, and Parylene on the first electrode 140, followed by patterning.

The support structure 210 may include seed metals 216, the first metal bulk 211, the second metal bulk 212 and an insulating portion 213, and may further include a first pad 214, a second pad 215 and an insulating support 217.

Referring to FIG. 2 to FIG. 4, the seed metals 216 may be disposed below the light emitting structure 110 and are separated from each other to be disposed under the first electrode 140 and the second electrode 120 and electrically connected to the first electrode 140 and the second electrode 120, respectively. The seed metals 216 allow the first metal bulk 211 to be efficiently formed on the lower surfaces of the second insulation layer 150 and the first electrode 140, allow the second metal bulk 212 to be efficiently formed on the lower surfaces of the second insulation layer 150 and the first electrode 140, and can act as an under bump metallization layer (UBM layer). The seed metals 216 may include Ti, Cu, Au, Cr, Ni, and the like. For example, the seed metals 216 may have a Ti/Cu stack structure.

Referring to FIG. 2 to FIG. 4, the first metal bulk 211 and the second metal bulk 212 may be disposed under the light emitting structure 110 and are separated from each other to be disposed under the first electrode 140 and the second electrode 120 and electrically connected to the first electrode 140 and the second electrode 120, respectively. The first and second metal bulks 211, 212 mean components that are formed of metallic materials and generally have a larger thickness than the light emitting structure 110. The first metal bulk 211 and the second metal bulk 212 may have a thickness of several dozen micrometers or more. The first metal bulk 211 and the second metal bulk 212 may be electrically connected to the first electrode 140 and the second electrode 120 and may be electrically connected to the first conductivity type semiconductor layer 111 and the second conductivity type semiconductor layer 113 therethrough, respectively. The first and second metal bulks 211, 212 can effectively dissipate heat generated from the light emitting structure 110 to the outside, and may include a material having a similar coefficient of thermal expansion to that of the light emitting structure 110. Each of the first metal bulk 211 and the second metal bulk 212 may have a rectangular lower surface, without being limited thereto. Alternatively, each of the first metal bulk 211 and the second metal bulk 212 may have a polygonal lower surface, as shown in FIG. 4. Alternatively, the lower surface of the first metal bulk 211 and the lower surface of the second metal bulk 212 may include an indented portion or a protruded portion formed at one side thereof to engage with each other in order to more efficiently prevent external contaminants from entering the light emitting element.

The contact regions R may be disposed above the second metal bulk 212. Referring to FIG. 3 and FIG. 4, the contact region R may extend not only to above the first metal bulk 211 but also to above the second metal bulk 212. The second insulation layer 150 may be interposed between the second metal bulk 212 and the first electrode 140 to insulate the first electrode 140 from the second metal bulk 212. With this structure, the light emitting element can prevent an adjoining region between the first electrode 140 and the first conductivity type semiconductor layer 111 from being biased to a certain location thereof, thereby improving current spreading efficiency. As a result, the light emitting element can have further improved luminous efficacy. Further, referring to FIG. 1 and FIG. 3, not only the first metal bulk 211 but also the second metal bulk 212 may be formed to extend along the second insulation layer 150 towards the upper surface of the light emitting structure 110 below the contact region R formed between the protrusions $M_2$ of the mesa M. Accordingly, both the first metal bulk 211 and the second metal bulk 212 can exhibit improved peel strength, thereby improving stability of the light emitting element.

The insulating portion 213 may be interposed between the first metal bulk 211 and the second metal bulk 212. The insulating portion 213 insulates the first metal bulk 211 from the second metal bulk 212 so as to insulate the first electrode 140 from the second electrode 120, fills a space between the first metal bulk 211 and the second metal bulk 212 to improve durability, and acts to relieve stress generated upon thermal expansion of the first and second metal bulks 211, 212. In addition, as shown in FIG. 2, the insulating portion 213 may be disposed not only in the space between the first metal bulk 211 and the second metal bulk 212, but also on a side surface of the first metal bulk 211 and a side surface of the second metal bulk 212, and may have a structure that completely surrounds the side surfaces of the first metal bulk 211 and the second metal bulk 212. With this structure, the light emitting element can be protected from external contaminants or impact. The insulating portion 213 may include an epoxy molding compound (EMC). In the structure wherein the first pad 214 and the second pad 215 are disposed on the lower surfaces of the first metal bulk 211 and the second metal bulk 212, respectively, the insulating portion 213 may be formed to cover a side surface of the first pad 214 and a side surface of the second pad 215.

The light emitting element according to exemplary embodiments may further include an insulating support 217. The insulating support 217 may cover the lower surface of the insulating portion 213, some regions of the lower surface of the first metal bulk 211 and some regions of the lower surface of the second metal bulk 212. Specifically, the insulating support 217 may include openings that partially expose the lower surface of the first metal bulk 211 and the lower surface of the second metal bulk 212, respectively. When the light emitting element is mounted on a circuit board via a bonding material such as solder, the insulating support 217 can prevent the solder from unnecessarily escaping through the openings. Further, in the structure wherein the light emitting element includes the first pad 214 and the second pad 215, it is possible to designate the locations of the first pad 214 and the second pad 215. The insulating support 217 may be formed of a general material used for a photo solder resist, without being limited thereto. The insulating support 217 may be formed of the same material as the insulating portion 213. In this case, the insulating support 217 may be formed therewith upon formation of the insulating portion 213.

The light emitting element according to exemplary embodiments may further include the first pad 214 and the second pad 215. The first pad 214 and the second pad 215 may be disposed on the lower surfaces of the first metal bulk 211 and the second metal bulk 212, respectively. When the light emitting element is mounted on a substrate via a bonding material such as solder, the first pad 214 and the second pad 21 act as external terminals of the light emitting element and prevent the bonding material from diffusing into the first and second metal bulks 211, 212. The first and second metal bulks 211, 212 may be formed of Ni, Pd, and the like. A distance between the first pad 214 and the second pad 215 may be greater than the distance between the first metal bulk 211 and the second metal bulk 212. This structure can effectively prevent the bonding material from causing short circuit between the first pad 214 and the second pad 215, thereby improving stability of the light emitting element. The first pad 214 and the second pad 215 may have the same length both in the longitudinal and transverse directions, without being limited thereto.

Figure 5:
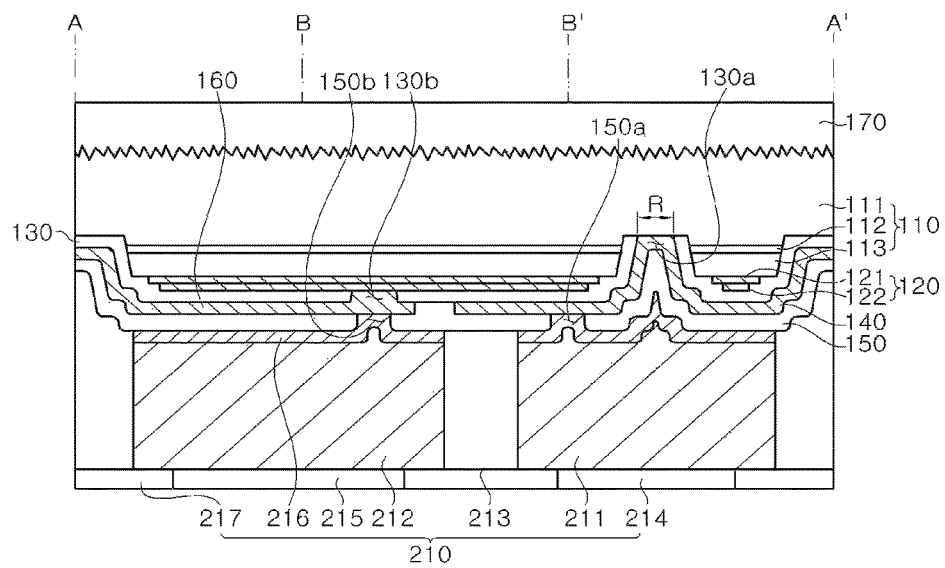
FIG. 5 is a cross-sectional view of a light emitting element according to another exemplary embodiment of the present disclosure.

FIG. 5 is a sectional view of a light emitting element according to another exemplary embodiment of the present disclosure. The light emitting element shown in FIG. 5 is similar to the light emitting element shown in FIG. 1 to FIG. 4, and may further include an insulation layer 170 formed on the upper or side surface of the light emitting structure 110. Specifically, the insulation layer 170 may be disposed on the upper surface of the first conductivity type semiconductor layer 111. In addition, the insulation layer 170 may also extend to the side surface of the first conductivity type semiconductor layer 111. Furthermore, the insulation layer 170 may also be disposed on side surfaces of the active layer 112 and the second conductivity type semiconductor layer 113. The insulation layer 170 can act to protect the light emitting structure 110 from external contaminants or impact. Accordingly, stability of the light emitting element can be improved. The insulation layer 170 may contain phosphors to change the wavelength of light emitted from the light emitting structure 110.

FIG. 6 to FIG. 16 are top views (a) and cross-sectional views (b) illustrating a method of manufacturing a light emitting element according to another embodiment of the present disclosure. In description of the method of manufacturing the light emitting element, the direction of FIG. 6 to FIG. 16 is opposite to the direction of FIG. 1 to FIG. 5. That is, the upward-downward direction of FIG. 6 to FIG. 16 is opposite to the upward-downward direction of FIG. 1 to FIG. 5. Hereinafter, in the description referring to FIG. 6 to FIG. 16, 'upper surface' and 'lower surface' are expressions only applied to FIG. 6 to FIG. 16 and opposite to the 'upper surface' and the 'lower surface' of FIG. 1 to FIG. 5, respectively.

Figure 6:
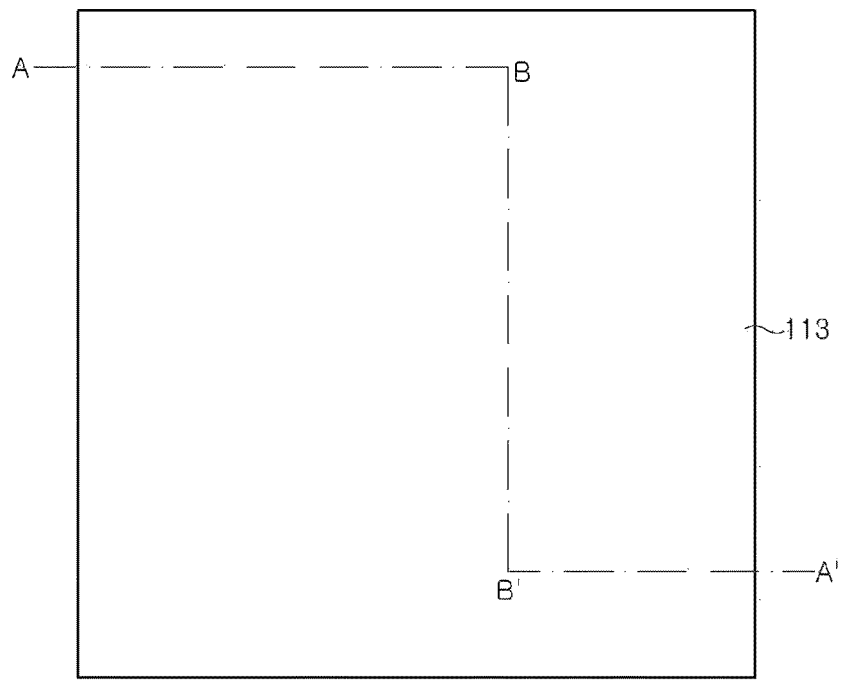
FIG. 6 is a plan view (a) and a cross-sectional view (b) illustrating a method of manufacturing a light emitting element according to another exemplary embodiment of the present disclosure.
Figure 6:
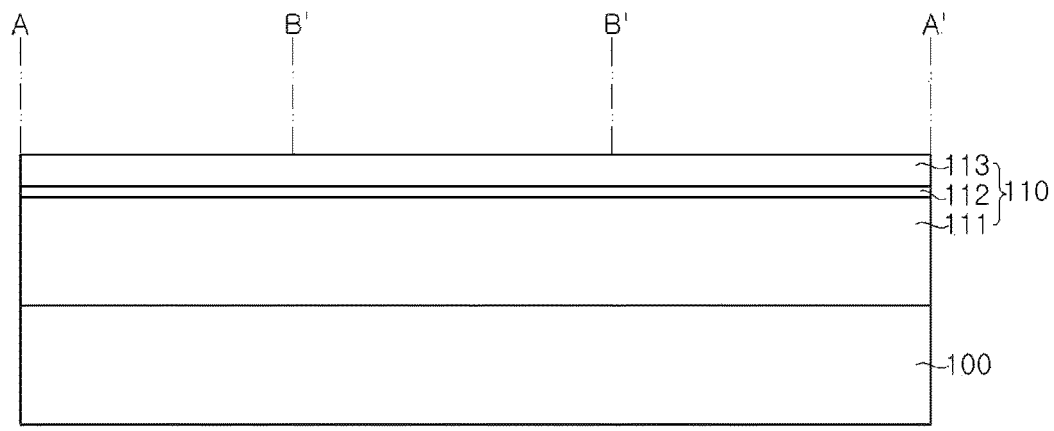

Referring to FIG. 6, a first conductivity type semiconductor layer 111, an active layer 112, and a second conductivity type semiconductor layer 113 are sequentially formed on an upper surface of a substrate 100. The substrate 100 may be selected from any substrates that allow a light emitting structure 110 to be grown thereon. For example, the substrate 100 may include a sapphire substrate, a silicon carbide substrate, a silicon substrate, a gallium nitride substrate, an aluminum nitride substrate, and the like. The first conductivity type semiconductor layer 111, the active layer 112, and the second conductivity type semiconductor layer 113 may be grown on the substrate by metal organic chemical vapor deposition (MOCVD) or molecular beam epitaxy (MBE).

Figure 7:
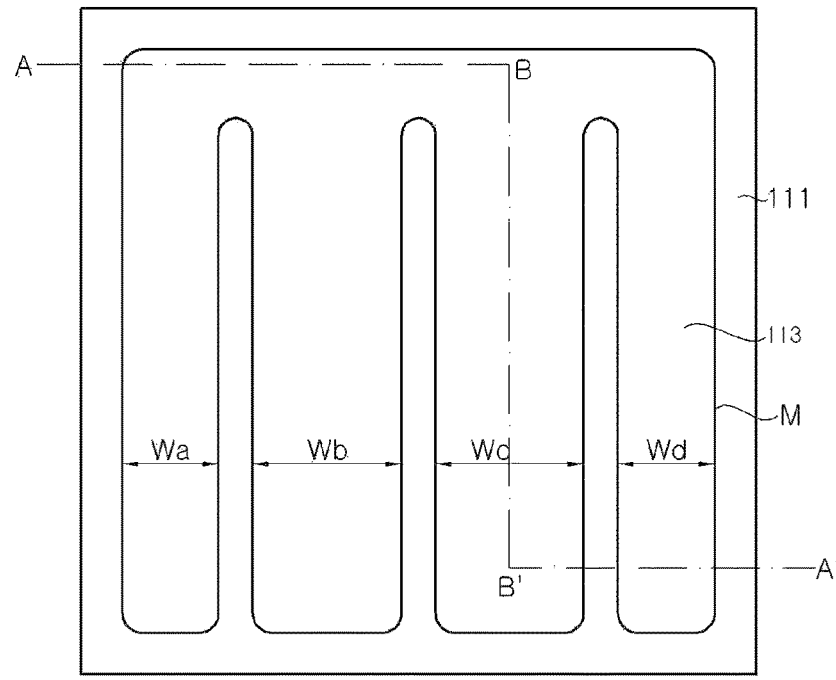
FIG. 7 is a plan view (a) and a cross-sectional view (b) illustrating a method of manufacturing a light emitting element according to a further exemplary embodiment of the present disclosure.
Figure 7:
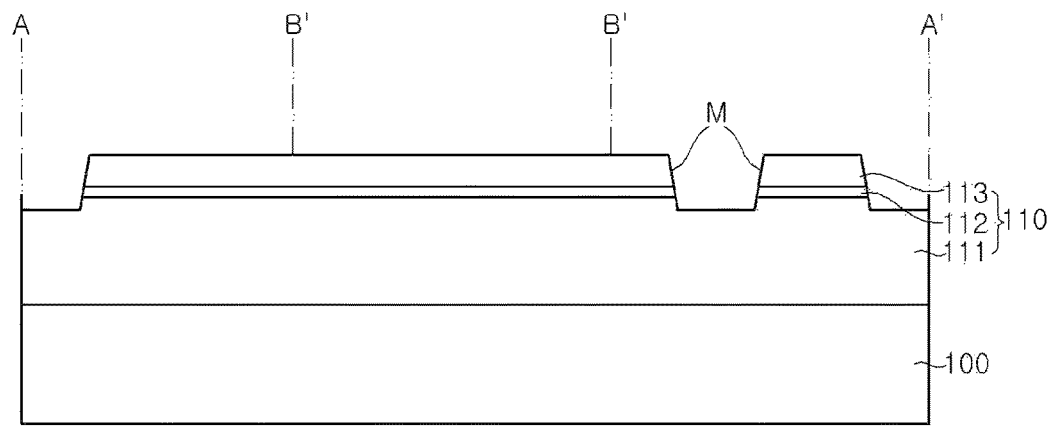

Referring to FIG. 7, a mesa M may be grown on the light emitting structure 110. Specifically, the mesa M may be formed by patterning the second conductivity type semiconductor layer 113 and the active layer 112 so as to expose the first conductivity type semiconductor layer 111. The mesa M may be formed to have an inclined side surface through a photoresist reflow process or the like. In this method, the mesa M may be formed to include a main body $M_1$ and a plurality of protrusions $M_2$ protruding from the main body $M_1$. Here, the protrusions may be formed such that protrusions disposed between two contact regions R have larger widths in the short axis direction than protrusions disposed between a side surface of the light emitting element and one contact region.

Figure 8:
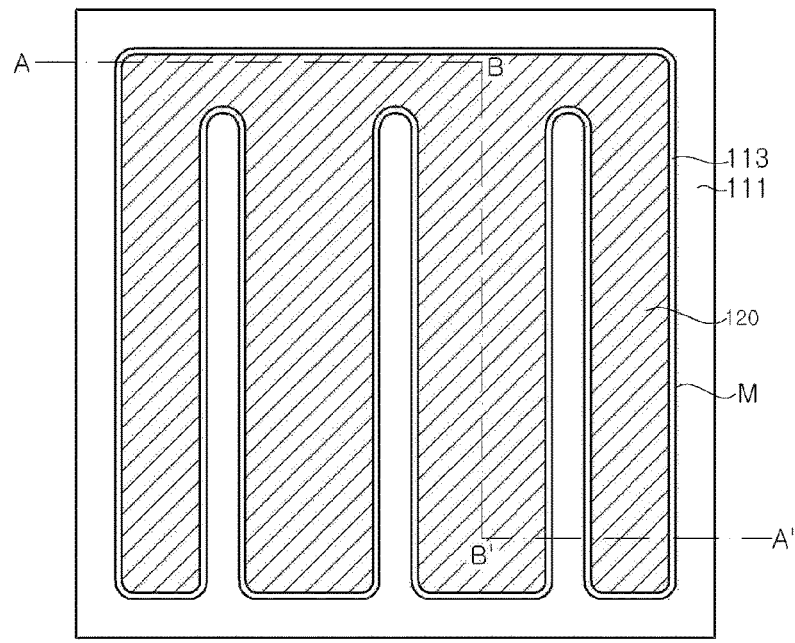
FIG. 8 is a plan view (a) and a cross-sectional view (b) illustrating a method of manufacturing a light emitting element according to yet another exemplary embodiment of the present disclosure.
Figure 8:
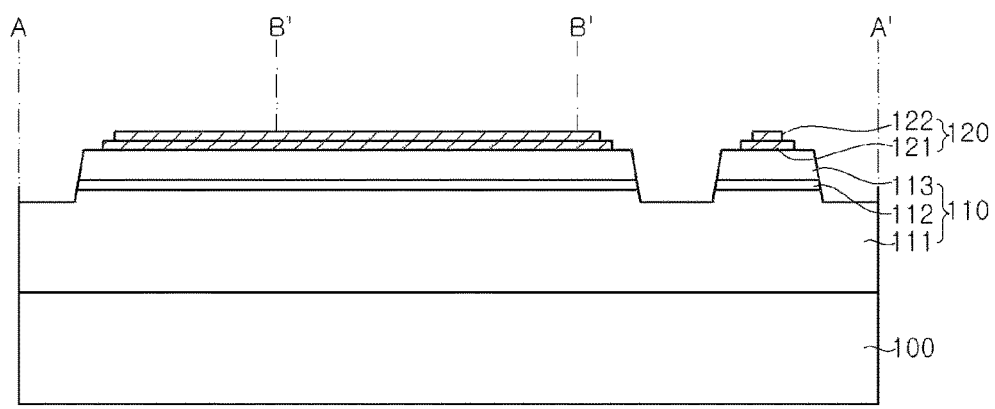

Referring to FIG. 8, a second electrode 120 may be formed on an upper surface of the second conductivity type semiconductor layer 113. Specifically, a reflective metal layer 121 and a barrier metal layer 122 may be formed on the upper surface of the second conductivity type semiconductor layer 113. The reflective metal layer 121 and the barrier metal layer 122 may be formed by e-beam deposition, vacuum deposition, sputtering, metal organic chemical vapor deposition (MOCVD), or the like. Specifically, a pattern of the reflective metal layer 121 may be formed and then the barrier metal layer 122 may be formed thereon.

Figure 9:
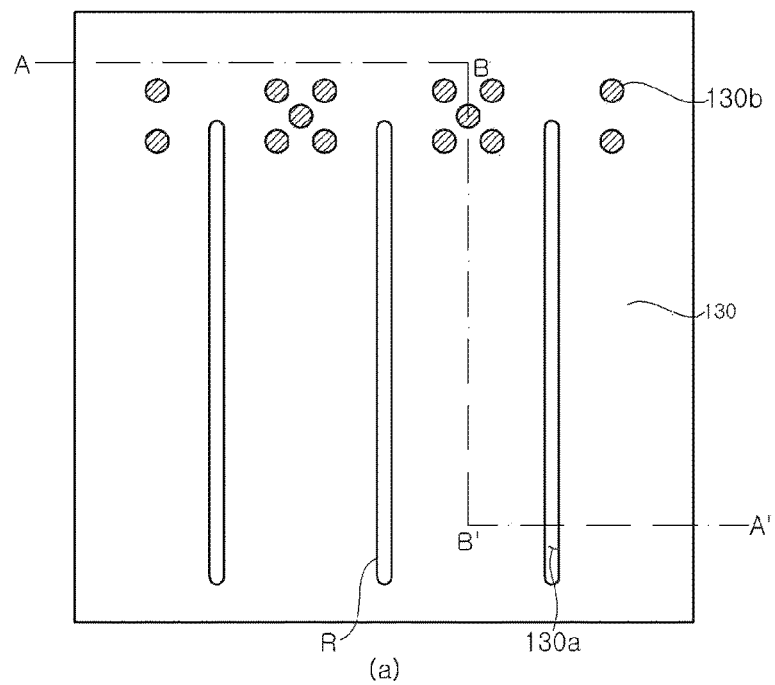
FIG. 9 is a plan view (a) and a cross-sectional view (b) illustrating a method of manufacturing a light emitting element according to yet another exemplary embodiment of the present disclosure.
Figure 9:
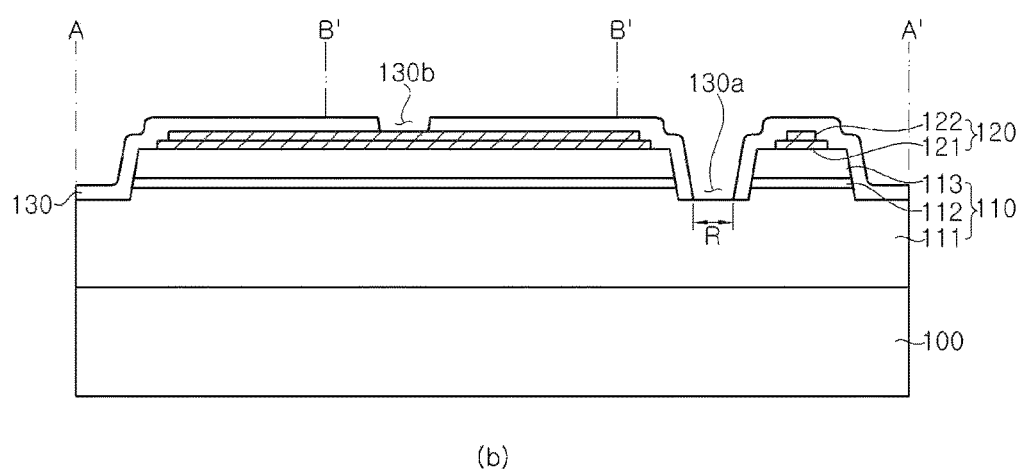

Referring to FIG. 9, a first insulation layer 130 may be formed on upper and side surfaces of the second electrode 120. The first insulation layer 130 may be composed of a single layer or multiple layers and may be formed by chemical vapor deposition (CVD) and the like. First opening 130a and second openings 130b may be formed using a mask, or by etching after deposition of the first insulation layer 130, without being limited thereto.

Figure 10:
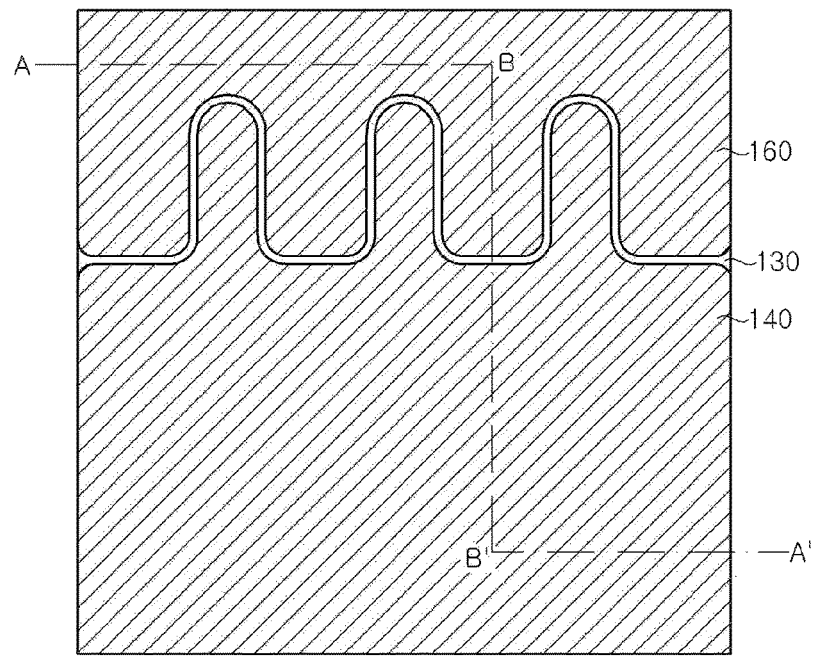
FIG. 10 is a plan view (a) and a cross-sectional view (b) illustrating a method of manufacturing a light emitting element according to yet another exemplary embodiment of the present disclosure.
Figure 10:
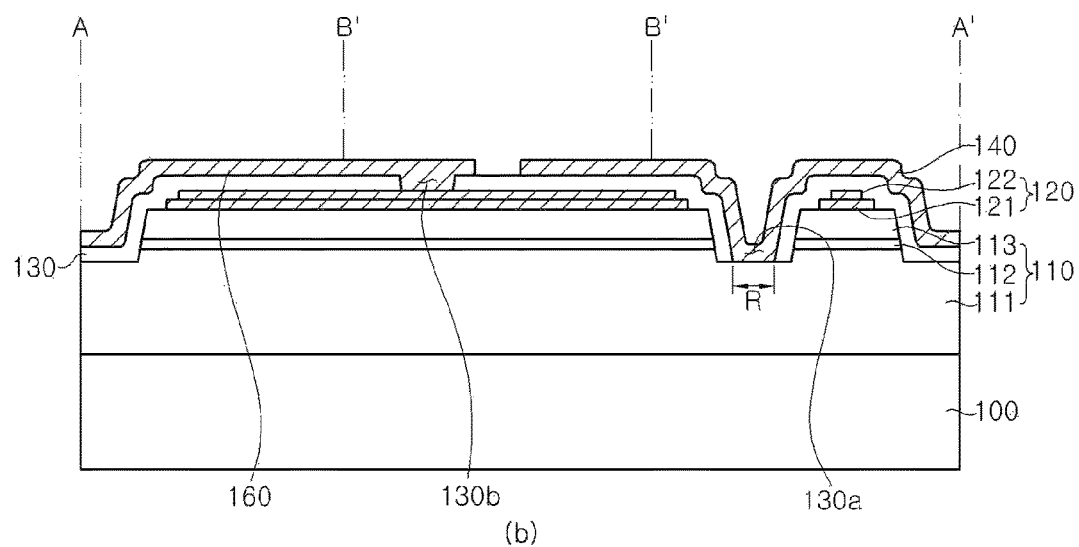

Referring to FIG. 10, a first electrode 140 may be formed on an upper surface of the first insulation layer 130. Further, an electrode cover layer 160 is disposed on the upper surface of the first insulation layer 130 and may be formed to adjoin the upper surface of the second electrode 120. The first electrode 140 and the electrode cover layer 160 may be formed at the same time by a single process, without being limited thereto. For example, the first electrode 140 may be formed after placing a mask on the entire region excluding a region in which the first electrode 140 will be formed, and the electrode cover layer 160 may be formed after removing the mask. When the first electrode 140 and the electrode cover layer 160 are formed by the same process, the first electrode 140 and the electrode cover layer 160 may be formed by e-beam deposition, vacuum deposition, sputtering, metal organic chemical vapor deposition (MOCVD), or the like, with the mask placed between the first electrode 140 and the electrode cover layer 160. The electrode cover layer 160 is formed to be partially interposed between the contact regions without overlapping the contact regions in the upward-downward direction.

Figure 11:
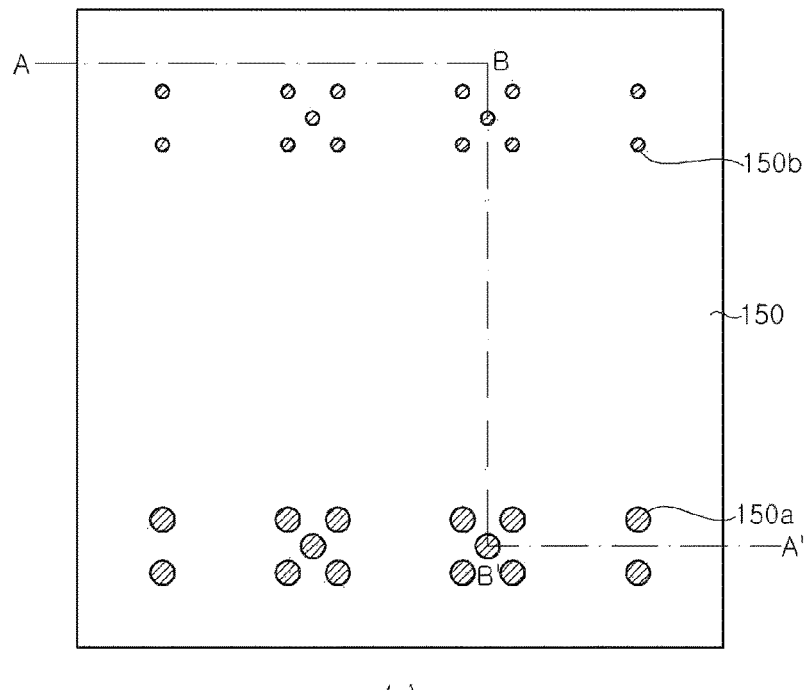
FIG. 11 is a plan view (a) and a cross-sectional view (b) illustrating a method of manufacturing a light emitting element according to yet another exemplary embodiment of the present disclosure.
Figure 11:
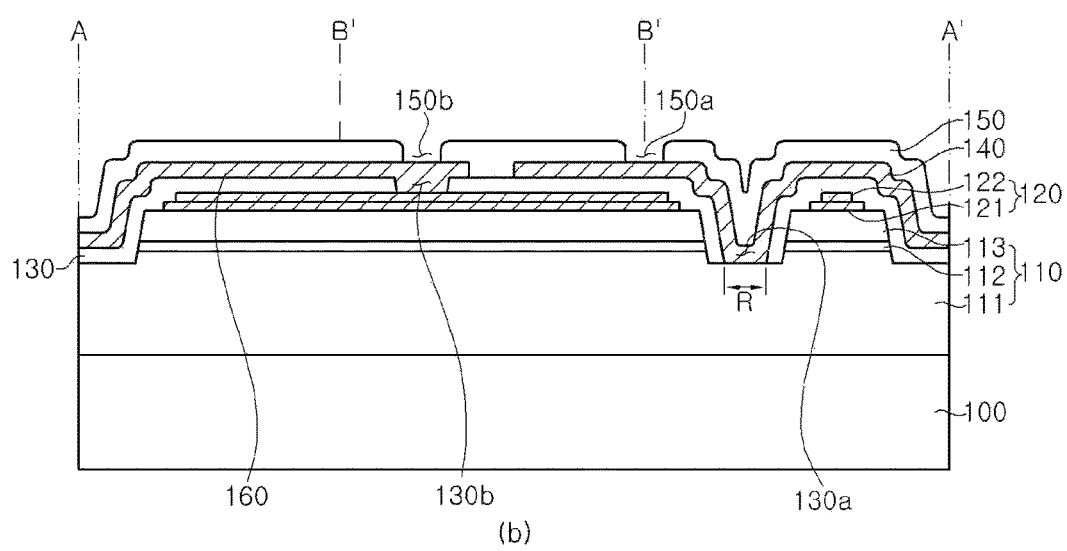

Referring to FIG. 11, a second insulation layer 150 may be formed on the upper surface of the first electrode 140 and the upper surface of the electrode cover layer 160. Openings 150a, 150b may be formed using a mask, or by etching after deposition of the second insulation layer 150, without being limited thereto. The openings may be formed by chemical vapor deposition (CVD) and the like.

Figure 12:
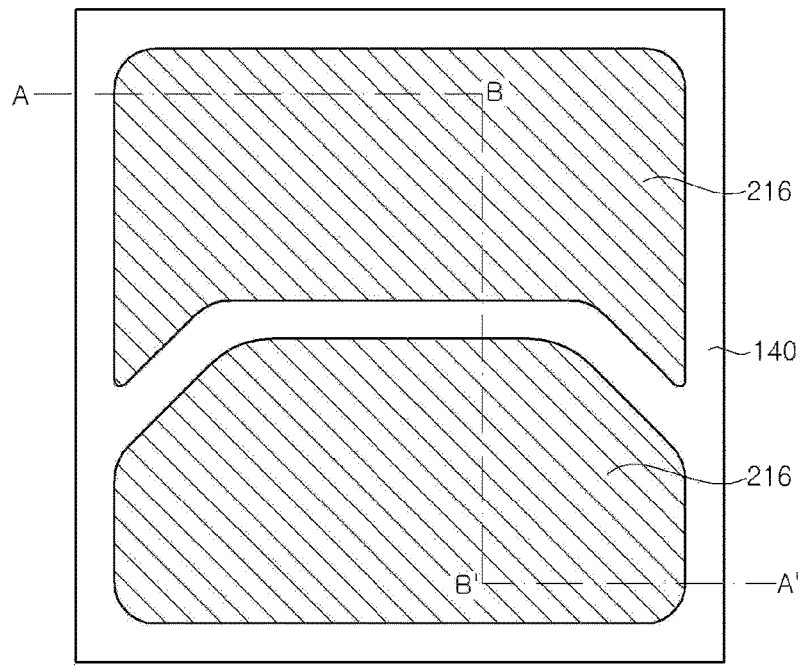
FIG. 12 is a plan view (a) and a cross-sectional view (b) illustrating a method of manufacturing a light emitting element according to yet another exemplary embodiment of the present disclosure.
Figure 12:
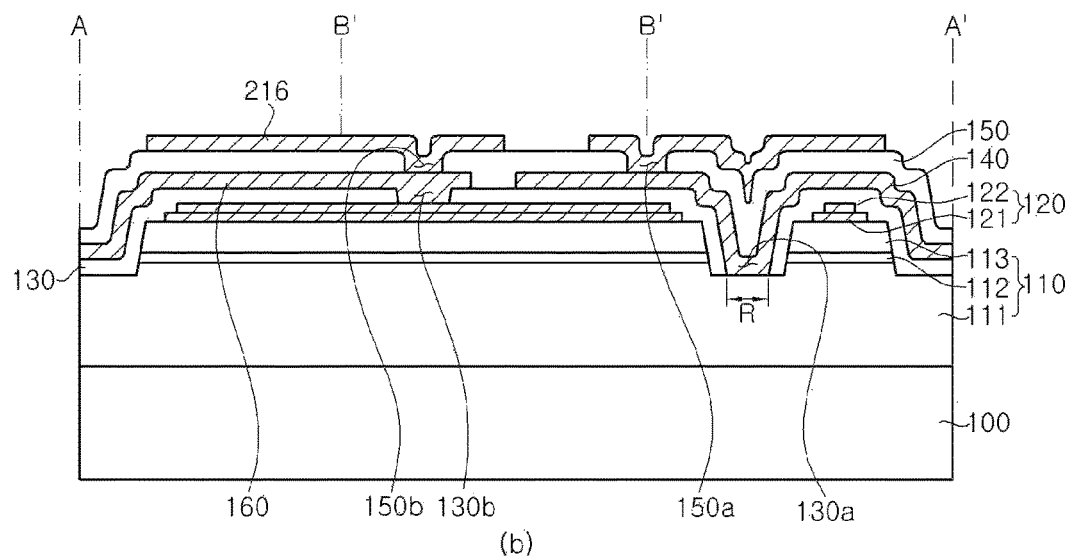
Figure 13:
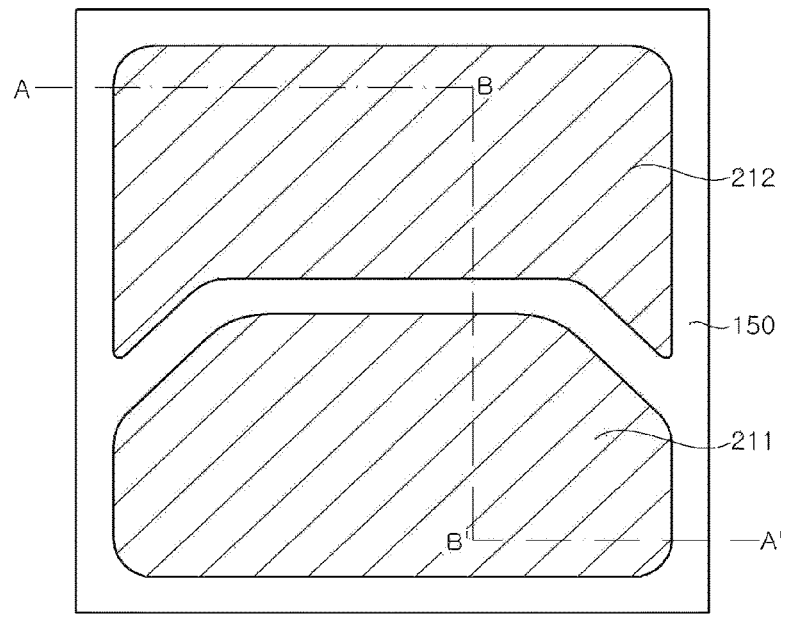
FIG. 13 is a plan view (a) and a cross-sectional view (b) illustrating a method of manufacturing a light emitting element according to yet another exemplary embodiment of the present disclosure.
Figure 13:
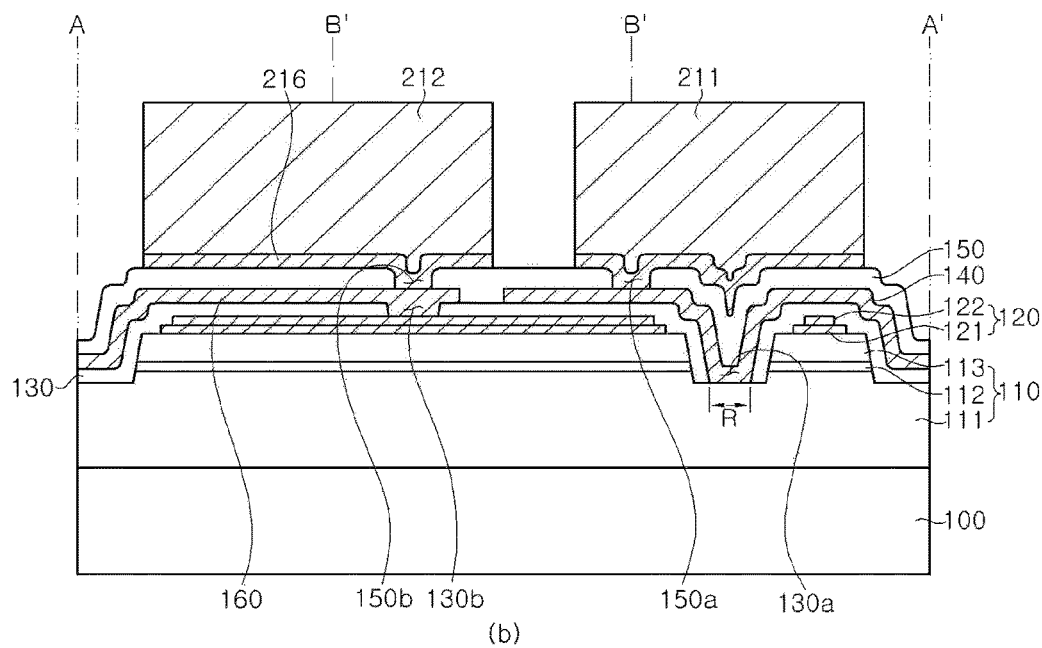

Referring to FIG. 12 and FIG. 13, seed metals 216 and first and second metal bulks 211, 212 may be formed on the second insulation layer 150. A mask is formed on the upper surface of the second insulation layer 150 so as to cover a portion of the upper surface of the second insulation layer 150 corresponding to a region in which an insulating portion 213 will be formed, and to open regions in which the seed metals 216 and the first and second metal bulks 211, 212 will be formed. Next, the seed metals 216 are formed in the open regions of the mask by sputtering, and the first metal bulk 211 and the second metal bulk 212 are formed on the seed metals 216 by plating. Then, the mask is removed by etching, thereby providing the seed metals 216 and the first and second metal bulks 211, 212 in desired shapes.

Alternatively, the first and second metal bulks 211, 212 may be formed by screen printing as follows. That is, a UBM layer is formed on at least part of the first and second openings 150a, 150b by deposition such as sputtering and patterning, or by deposition and lift-off. The UBM layer may be formed on regions in which the first and second metal bulks 211, 212 will be formed, and may include a Ti or TiW layer and a single layer or combined layer of Cu, Ni or Au. For example, the UBM layer may have a Ti/Cu stack structure. Thereafter, a mask is formed so as to cover a portion corresponding to a region in which the insulating portion 213 will be formed and to open regions in which the first and second metal bulks 211, 212 will be formed. Next, a material, such as Ag pastes, Au pastes, Cu pastes, and the like, is supplied to the open regions through screen printing, and is then cured. Thereafter, the first and second metal bulks 211, 212 can be formed by removing the mask through etching.

Figure 14:
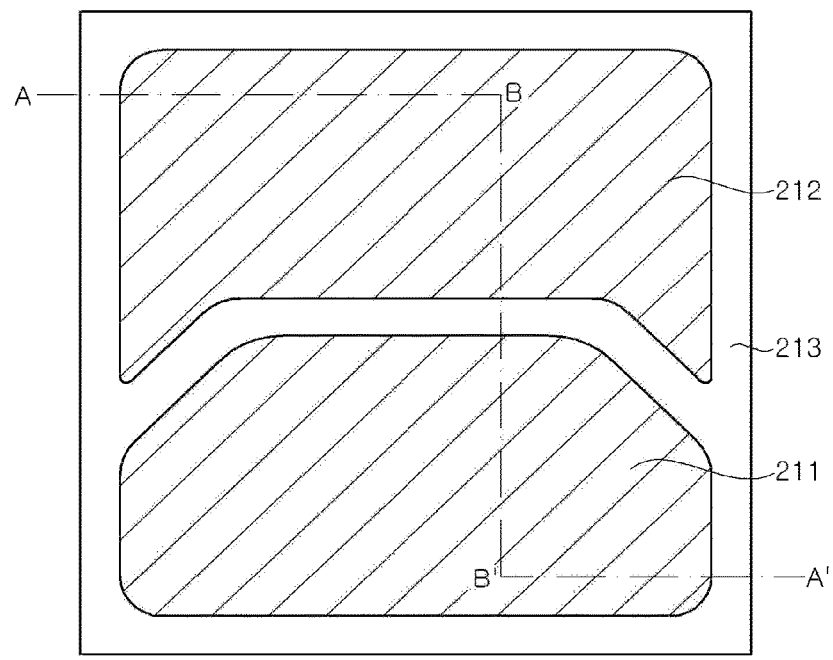
FIG. 14 is a plan view (a) and a cross-sectional view (b) illustrating a method of manufacturing a light emitting element according to yet another exemplary embodiment of the present disclosure.
Figure 14:
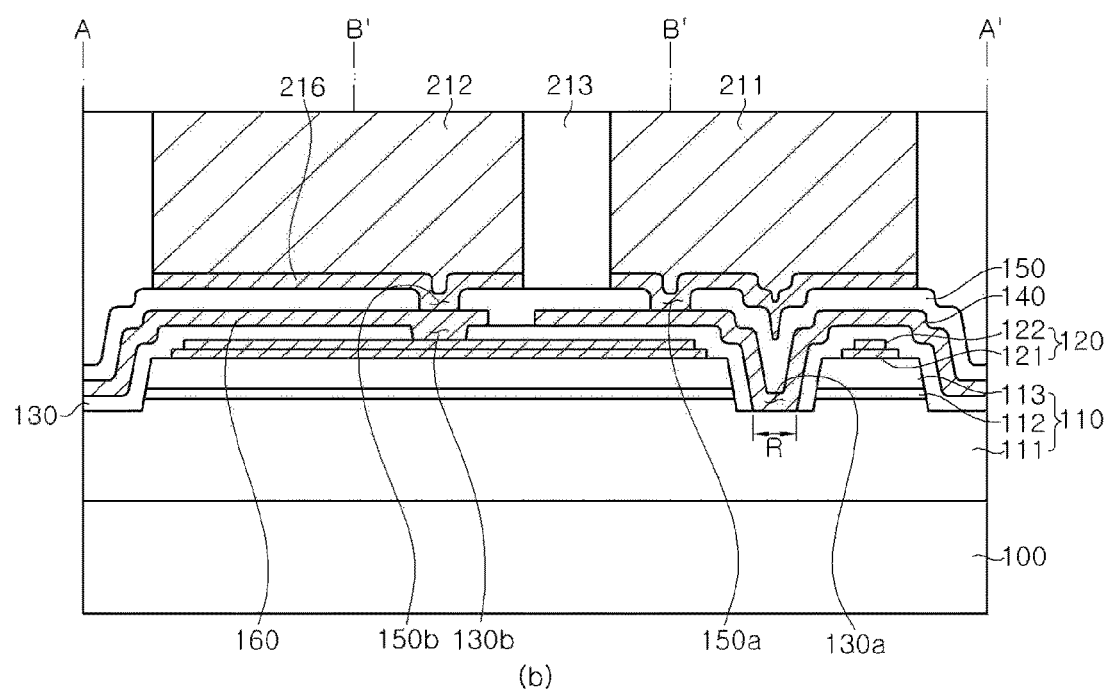
Figure 15:
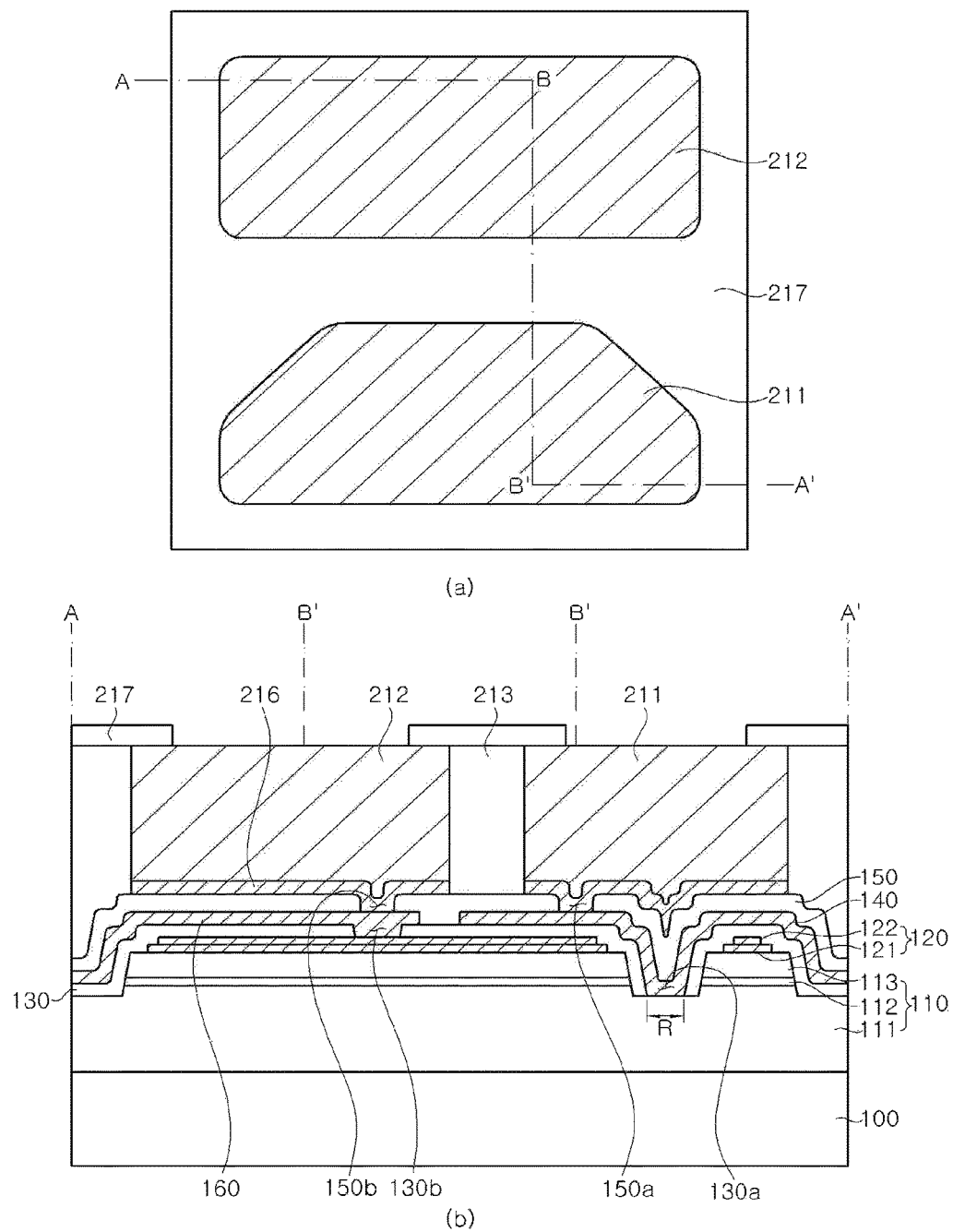
FIG. 15 is a plan view (a) and a cross-sectional view (b) illustrating a method of manufacturing a light emitting element according to yet another exemplary embodiment of the present disclosure.
Figure 16:
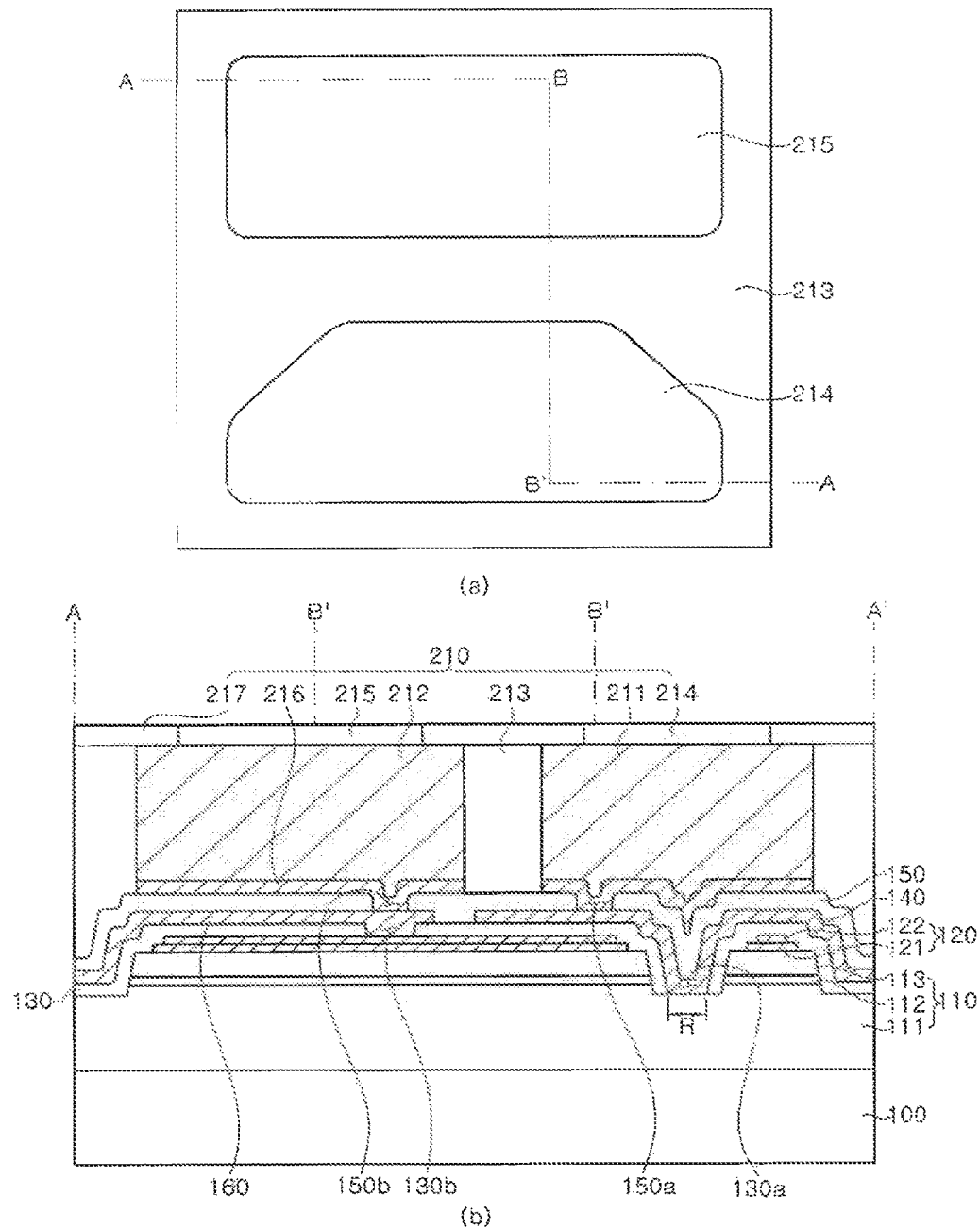
FIG. 16 is a plan view (a) and a cross-sectional view (b) illustrating a method of manufacturing a light emitting element according to yet another exemplary embodiment of the present disclosure.

Referring to FIG. 14, the insulating portion 213 may be formed between the first metal bulk 211 and the second metal bulk 212. The insulating portion 213 may be formed by printing or coating. The insulating portion 213 may be coated to cover the upper surface of the first metal bulk 211 and the upper surface of the second metal bulk 212, and the upper surface of the insulating portion 213 may be flattened by lapping, chemical vapor deposition (CVD), and the like so as to expose the first and second metal bulks 211, 212.

For the structure wherein the light emitting element further includes the insulating support 217, the first pad 214 and the second pad 215, FIG. 13 and FIG. 14 show a method of forming the insulating support 217, the first pad 214 and the second pad 215. Referring to FIG. 13, the insulating support 217 may be formed on the upper surface of the insulating portion 213 by printing or coating, and a mask may be disposed thereon to open some regions of the upper surface of the first metal bulk 211 and some regions of the upper surface of the second metal bulk 212. Referring to FIG. 14, the first pad 214 and the second pad 215 may be formed on the upper surface of the first metal bulk 211 and the upper surface of the second metal bulk 212 by e-beam deposition, vacuum deposition, sputtering or metal organic chemical vapor deposition (MOCVD). Furthermore, the first pad 214 and the second pad 215 may be formed only in an open region of the upper surface of the first metal bulk 211 and in an open region of the upper surface of the second metal bulk 212, which are open by the mask, respectively.

The substrate 100 may be removed from the light emitting structure 110 by a technique well-known in the art, such as laser lift-off, after formation of the support structure 210.

Figure 17:
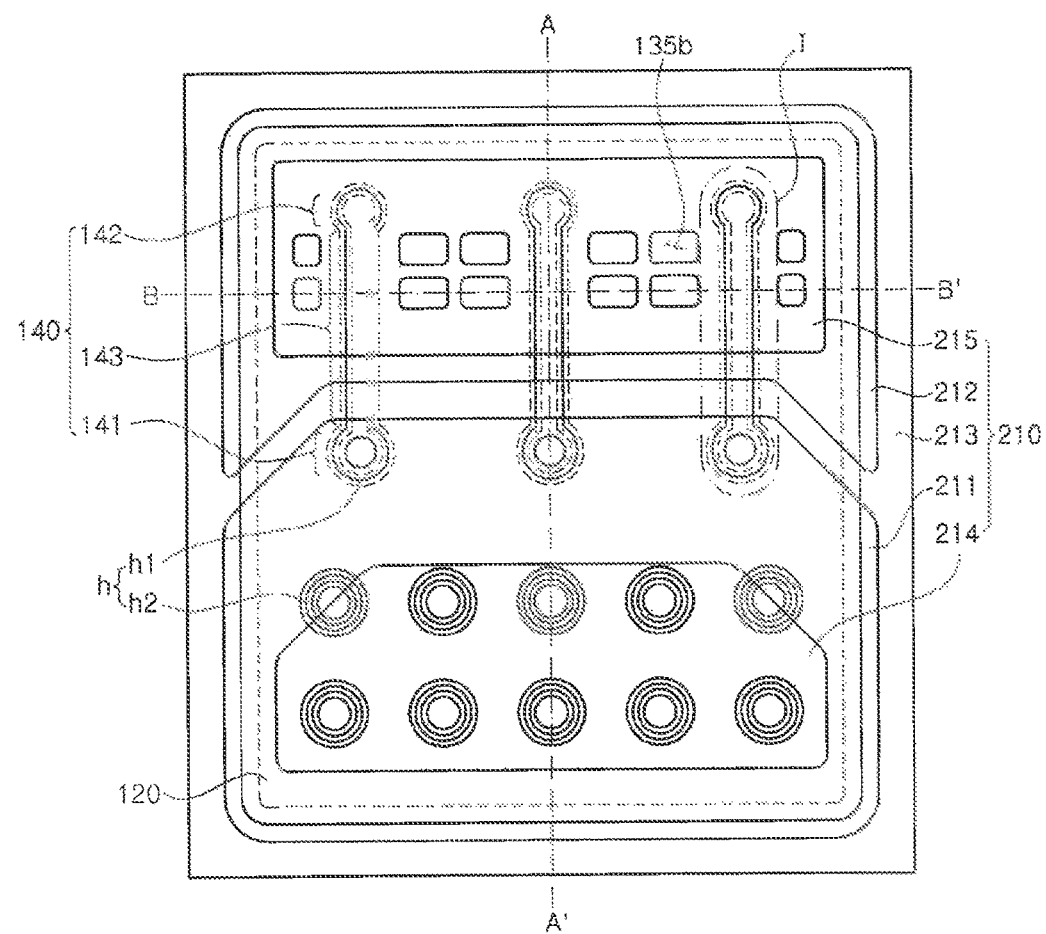
FIG. 17 is a plan view of a light emitting element according to one exemplary embodiment of the present disclosure.
Figure 18:
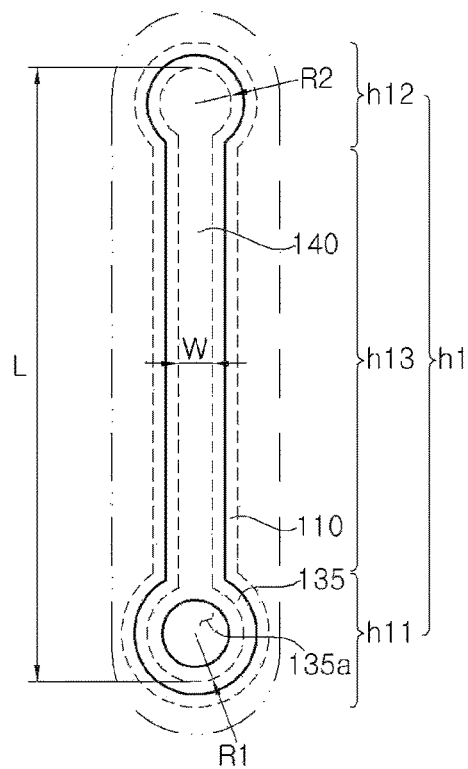
FIG. 18 is an enlarged view of part I of the light emitting element according to the exemplary embodiment of the present disclosure.
Figure 19:
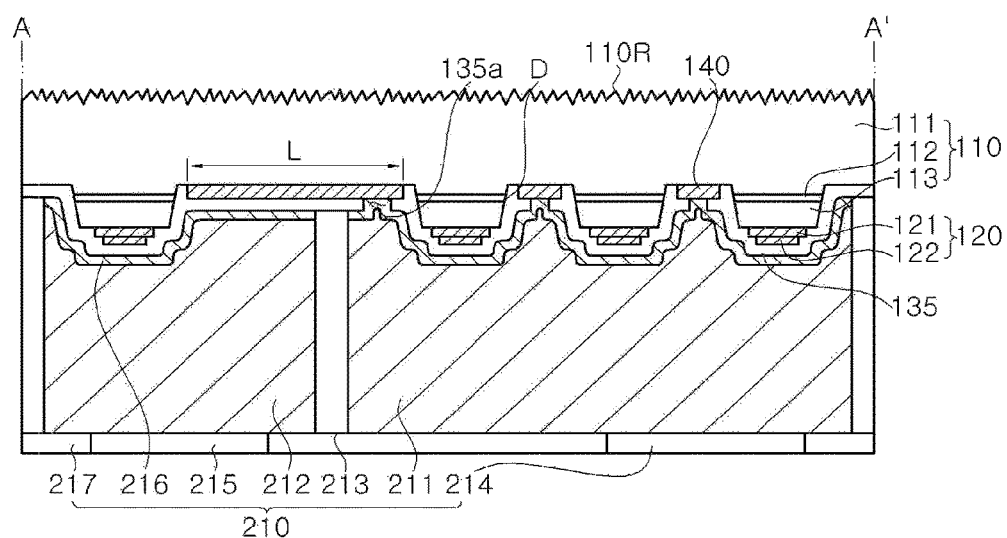
FIG. 19 and FIG. 20 are cross-sectional views of the light emitting element according to the exemplary embodiment of the present disclosure.
Figure 20:
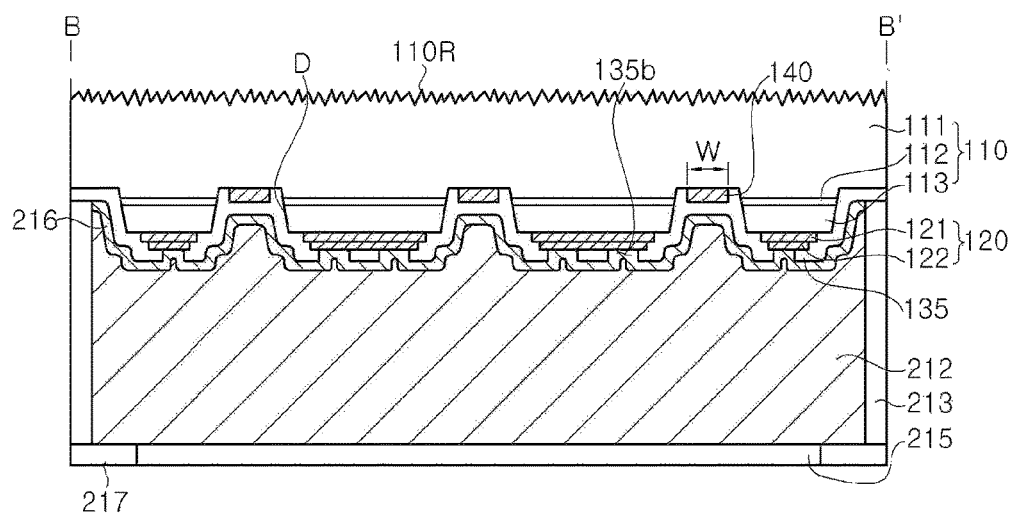

FIG. 17 to FIG. 20 are plan views and cross-sectional views of a light emitting element according to one exemplary embodiment of the present disclosure. FIG. 17 is a top plan view of the light emitting element and FIG. 18 is an enlarged view of part I of the light emitting element shown in FIG. 17. FIG. 19 is a cross-sectional view taken along line A-A' of FIG. 17. FIG. 20 is a cross-sectional view taken along line B-B' of FIG. 17. Detailed description of components similar to or substantially the same as the components of the above exemplary embodiments will be omitted.

Referring to FIG. 17 to FIG. 20, the light emitting element includes a light emitting structure 110, a second electrode 120, a first electrode 140, an insulation layer 135, and a support structure 210.

The light emitting structure 110 includes a first conductivity type semiconductor layer 111, a second conductivity type semiconductor layer 113 disposed on a lower surface of the first conductivity type semiconductor layer 111, and an active layer 112 interposed between the first conductivity type semiconductor layer 111 and the second conductivity type semiconductor layer 113.

The light emitting structure 110 may include at least one hole (h) formed through the second conductivity type semiconductor layer 113 and the active layer 112 to expose the first conductivity type semiconductor layer 111. The hole (h) may be formed by partially removing the second conductivity type semiconductor layer 113 and the active layer 112. As shown in FIG. 19 to FIG. 20, the hole (h) may include an inclined side surface D. The inclined side surface D of the hole (h) enhances efficiency in extraction of light generated from the active layer 112. The first electrode 140 may be electrically connected to the first conductivity type semiconductor layer 111 through the hole (h).

The hole (h) may include a first hole h1. Referring to FIG. 18, the first hole h1 may include a first region h11, a second region h12, and a connection portion h13. The second region h12 may be disposed at an opposite side to the first region h11. Thus, a portion of the first electrode 140 disposed in the first hole h1 may adjoin the first conductivity type semiconductor layer 111 in a long region, thereby preventing the portion of the first electrode 140 from being excessively biased to one side of the light emitting element. With this structure, the light emitting element can have improved luminous efficacy through improvement in current spreading efficiency.

The first region h11 may have a larger area than the second region h12. For example, when the first region h11 and/or the second region h12 have a circular shape, the first region h11 may have a larger diameter than the second region h12. In this structure, a first portion 141 of the first electrode 140 disposed in the first region h11 may be larger than a second portion 142 of the first electrode 140 disposed in the second region h12. Accordingly, the light emitting region is not excessively narrowed by the second portion 142 having a relatively small area. Further, the first region h11 having a relatively large area allows the first portion 141 and the light emitting structure 110 to adjoin each other in a large area and also allows the first portion 141 and a first metal bulk 211 to adjoin each other in a large area. As a result, a metallic material may be disposed in a wide and sufficiently thick region in the upward-downward direction under a region in which the first portion 141 adjoins the light emitting structure 110. In general, upon removal of the substrate from the light emitting element, cracks are likely to be generated near the center of the light emitting structure 110 adjacent to an upper side of an insulating portion 213 interposed between the first metal bulk 211 and a second metal bulk 212. According to exemplary embodiments, since the metallic material may be disposed in a wide and thick region under the center of the light emitting structure 110, stress and strain applied to the light emitting structure 110 upon separation of the substrate can be relieved by the metallic material, thereby preventing generation of cracks in the light emitting structure 110.

The hole (h) may include at least one second hole h2. The second hole h2 can increase a region in which the first electrode 140 can be electrically connected to the first conductivity type semiconductor layer 111. With this structure, the light emitting element can have improved luminous efficacy through improvement in current spreading efficiency.

The first electrode 140 may be disposed in the hole (h). The first electrode 140 may be placed on the lower surface of the first conductivity type semiconductor layer 111 exposed through the hole (h). With this structure, the first electrode 140 can be electrically connected to the first conductivity type semiconductor layer 111. The first electrode 140 may be separated from the side surface of the hole (h) by a constant distance. Accordingly, the first electrode 140 can be electrically insulated from the active layer 112 and the second conductivity type semiconductor layer 113. A separation space between the first electrode 140 and the side surface of the hole (h) may be filled with the insulation layer 135 described below. The first electrode 140 may have a height equal to or less than the height of the hole (h).

The first electrode 140 may have a shape corresponding to the shape of the hole (h). For example, referring to FIG. 17 and FIG. 18, in a structure wherein the first and second regions h11 and h12 of the hole (h) have a circular shape and the connection portion h13 of the hole (h) has a linear shape, the first electrode 140 may also have circular portions and a linear portion corresponding to the shapes of the hole.

A portion of the first electrode 140 disposed in the first hole h1 may include a first portion 141, a second portion 142, and a third portion 143. The first portion 141 and the second portion 142 may have a circular shape, without being limited thereto. With this structure, the first portion 141 may have a radius R1 of about 22 μm to about 24 μm, preferably about 23 μm, and the second portion 142 may have a radius R2 of about 14 μm to about 16 μm, preferably about 15 μm. The second portion 142 may be disposed at an opposite side to the first portion 141. In the structure wherein the first portion 141 and the second portion 142 have a circular shape, stress and strain generated upon separation of the substrate can be uniformly dispersed around the first portion 141 and the second portion 142, thereby reducing damage to the light emitting element.

The first portion 141 may be larger than the second portion 142. Accordingly, since it is possible to improve current spreading efficiency of the light emitting element without excessively narrowing the light emitting region, the light emitting element can have improved luminous efficacy. For example, in the structure wherein the first portion 141 and the second portion 142 have a circular shape, the radius R1 of the first portion 141 may be larger than the radius R2 of the second portion 142.

The third portion 143 may connect the first portion 141 to the second portion 142. Referring to FIG. 17, the third portion 143 has a linear shape and may be interposed between the first and second portions 141, 142. The third portion 143 may have a linewidth W of about 11 μm to 13 μm, preferably 12 μm. Within this range of linewidth, the light emitting element can secure a sufficient light emitting region therein.

The first electrode 140 may include a highly reflective metal layer, such as an Al layer. The highly reflective metal layer may be formed on a bonding layer such as a Ti, Cr or Ni layer. In addition, a protective layer composed of a single layer or combined layer of Ni, Cr, or Au may be formed on the highly reflective metal layer. The first electrode 140 may have a multilayer structure of, for example, Ti/Al/Ti/Ni/Au. The first electrode 140 may be formed by depositing a metallic material, followed by patterning.

The second electrode 120 may be insulated from the first electrode 140 and may be disposed on the lower surface of the second conductivity type semiconductor layer 113. The second electrode 120 may be electrically connected to the second conductivity type semiconductor layer 113.

The second electrode 120 includes a reflective metal layer 121 and may further include a barrier metal layer 122. The second electrode 120 may include a conductive oxide, such as indium tin oxide (ITO). The conductive oxide is composed of a metallic oxide having high luminous transmittance, thereby improving luminous efficacy by suppressing absorption of light by the second electrode 120. A separate electrode cover layer may be disposed on the lower surface of the second electrode 120. The electrode cover layer serves to prevent diffusion of a bonding material such as solder into the second electrode 120. The electrode cover layer may be formed of the same material as the first electrode 140, without being limited thereto.

The insulation layer 135 insulates the first electrode 140 from the second electrode 120 and serves to protect the light emitting structure 110 from external contaminants such as moisture and the like. The insulation layer 135 may be disposed on the lower and side surfaces of the first electrode 140 and on the lower and side surfaces of the second electrode 120. The insulation layer 135 may include openings 135a, 13bb in particular regions to allow electrical connection to the first conductivity type semiconductor layer 111 and the second conductivity type semiconductor layer 113 therethrough. For example, the insulation layer 135 may include first openings 135a that expose the first electrode 140 and second openings 135b that expose the second electrode 120. The first openings 135a and the second openings 135b may be filled with the first metal bulk 211 and the second metal bulk 212, respectively. Specifically, referring to FIG. 17 to FIG. 20, the first opening 135a may be disposed on the lower surface of the first portion 141 and on the lower surface of the portion of the first electrode 140 disposed in the second hole h2. The insulation layer 135 may include an oxide layer such as $SiO_2$, a nitride layer such as $SiN_x$, or an insulating layer such as $MgF_2$. Furthermore, the insulation layer 135 may include a distributed Bragg reflector (DBR) in which low refractive index material layers and high refractive index material layers are alternately stacked one above another. For example, an insulation reflective layer having high reflectivity may be formed by stacking $SiO_2/TiO_2$ layers or $SiO_2/Nb_2O_5$ layers.

The light emitting element according to this exemplary embodiment may further include a stress relieving layer (not shown). The stress relieving layer may be disposed on the lower surface of the insulation layer 135. Adhesive strength between the stress relieving layer and the insulating portion 213 may be higher than adhesive strength between the insulation layer 135 and the insulating portion 213. Accordingly, as compared with the structure wherein the insulating portion 213 is formed on the lower surface of the insulation layer 135, the structure wherein the insulating portion 213 is formed on the lower surface of the stress relieving layer significantly reduces a probability of separation or delamination at an interface therebetween. Accordingly, this structure prevents damage to the light emitting element due to delamination of the insulating portion 213, thereby improving reliability of the light emitting element. With this effect, the stress relieving layer exhibits stress relieving behavior and may include an insulating material capable of improving adhesion. For example, the stress relieving layer may include at least one of polyimides, Teflon, benzocyclobutene (BCB), and Parylene. In particular, the stress relieving layer may include a photosensitive material (for example, polyimide). When the stress relieving layer includes the photosensitive material, it is possible to form the stress relieving layer simply through a process of developing the photosensitive material. Accordingly, a separate patterning process can be omitted, thereby simplifying a process of manufacturing a light emitting element. The stress relieving layer may adjoin the support structure 210. The stress relieving layer may be formed by deposition and patterning. Furthermore, the stress relieving layer and the insulation layer 135 may be simultaneously subjected to patterning.

The light emitting structure 110 may further include a roughened surface 110R.

The support structure 210 includes seed metals 216, the first metal bulk 211, the second metal bulk 212 and the insulating portion 213, and may further include a first pad 214, a second pad 215 and an insulating support 217.

Referring to FIG. 17 to FIG. 20, the seed metals 216 may be disposed under the light emitting structure 110 and are separated from each other to be disposed under the first electrode 140 and the second electrode 120 and electrically connected to the first electrode 140 and the second electrode 120, respectively.

Referring to FIG. 17 to FIG. 20, the first metal bulk 211 and the second metal bulk 212 may be disposed under the light emitting structure 110 and are separated from each other to be disposed under the first electrode 140 and the second electrode 120 and electrically connected to the first electrode 140 and the second electrode 120, respectively. The first and second metal bulks 211, 212 mean components that are formed of metallic materials and generally have a larger thickness than the light emitting structure 110. The first metal bulk 211 and the second metal bulk 212 may have a thickness of several dozen micrometers or more. The first metal bulk 211 and the second metal bulk 212 may be electrically connected to the first electrode 140 and the second electrode 120 through the openings 135*a*, 135*b* and may be electrically connected to the first conductivity type semiconductor layer 111 and the second conductivity type semiconductor layer 113 therethrough, respectively. The first and second metal bulks 211, 212 can effectively dissipate heat generated from the light emitting structure 110 to the outside, and may include a material having a similar coefficient of thermal expansion to that of the light emitting structure 110. Each of the first metal bulk 211 and the second metal bulk 212 may have a rectangular lower surface, without being limited thereto. Alternatively, each of the first metal bulk 211 and the second metal bulk 212 may have a polygonal lower surface, as shown in FIG. 17. Alternatively, the lower surface of the first metal bulk 211 and the lower surface of the second metal bulk 212 may include an indented portion or a protruded portion formed at one side thereof to engage with each other in order to more efficiently prevent external contaminants from entering the light emitting element.

The first metal bulk 211 may have a larger area than the second metal bulk 212. Specifically, the first metal bulk 211 has a larger area than the second metal bulk 212 and may cover a central portion of the lower surface of the light emitting structure 110. In general, when individual light emitting elements are moved in a packaging process, an ejector pin disposed under a lower end of the light emitting element pushes the center of the lower surface of the light emitting element to lift the light emitting element, which in turn is moved by a separate apparatus. Accordingly, with the structure wherein the first metal bulk 211 is formed to cover the central portion of the lower surface of the light emitting structure 110, the light emitting structure 110 can be prevented from directly contacting the ejector pin, thereby reducing damage to the light emitting element by the ejector pin. Further, since the first metal bulk 211 has a relatively larger area, it is possible to prevent excessive increase in the length of the third portion 143 of the first electrode 140. Accordingly, when high current is applied to the light emitting element, it is possible to prevent part of the first electrode 140 from acting as a high resistance component, and thus the light emitting element can have improved current spreading efficiency. The first region h11 may be formed on the first metal bulk 211 and the second region h12 may be formed on the second metal bulk 212. Thus, an adjoining region between the first electrode 140 and the first conductivity type semiconductor layer 111 is not biased to one side of the light emitting element, thereby improving current spreading efficiency of the light emitting element.

The insulating portion 213 may be interposed between the first metal bulk 211 and the second metal bulk 212. The insulating portion 213 insulates the first and second metal bulks 211, 212 from each other and thus insulates the first and second electrodes 140, 120 from each other. In addition, the insulating portion 213 fills the space between the first metal bulk 211 and the second metal bulk 212 to improve durability and serves to relieve stress upon thermal expansion of the first and second metal bulks 211, 212. In addition, as shown in FIG. 19 and FIG. 4, the insulating portion 213 may be disposed not only between the first metal bulk 211 and the second metal bulk 212, but also on the side surfaces of the first and second metal bulks 211, 212 to surround the first and second metal bulks 211, 212. With this structure, the light emitting element can be protected from external contaminants or impact. The insulating portion 213 may include an epoxy molding compound (EMC). In the structure wherein the first pad 214 and the second pad 215 are disposed on the lower surfaces of the first metal bulk 211 and the second metal bulk 212, respectively, the insulating portion 213 may be formed to cover a side surface of the first pad 214 and a side surface of the second pad 215.

The light emitting element according to the exemplary embodiment may further include an insulating support 217. The insulating support 217 may cover the lower surface of the insulating portion 213, some regions of the lower surface of the first metal bulk 211 and some regions of the lower surface of the second metal bulk 212. Specifically, the insulating support 217 may include openings that partially expose the lower surface of the first metal bulk 211 and the lower surface of the second metal bulk 212, respectively.

The light emitting element according to the exemplary embodiment may further include the first pad 214 and the second pad 215. The first pad 214 and the second pad 215 may be disposed on the lower surfaces of the first metal bulk 211 and the second metal bulk 212, respectively. A distance between the first pad 214 and the second pad 215 may be greater than the distance between the first metal bulk 211 and the second metal bulk 212. This structure can effectively prevent the bonding material from causing short circuit between the first pad 214 and the second pad 215, thereby improving stability of the light emitting element. The first pad 214 and the second pad 215 may have the same length both in the longitudinal and transverse directions, without being limited thereto.

FIG. 21 to FIG. 30 are plan views (a) and cross-sectional views (b) illustrating a method of manufacturing a light emitting element according to a further exemplary embodiment of the present disclosure. In description of the method of manufacturing the light emitting element, the direction of FIG. 21 to FIG. 30 is opposite to the direction of FIG. 17 to FIG. 20. That is, the upward-downward direction of FIG. 21 to FIG. 30 is opposite to the direction of FIG. 17 to FIG. 20. Hereinafter, in the description referring to FIG. 21 to FIG. 30, 'upper surface' and 'lower surface' are expressions only applied to FIG. 21 to FIG. 30 and are opposite to the 'upper surface' and the 'lower surface' of FIG. 17 to FIG. 20.

Figure 21:
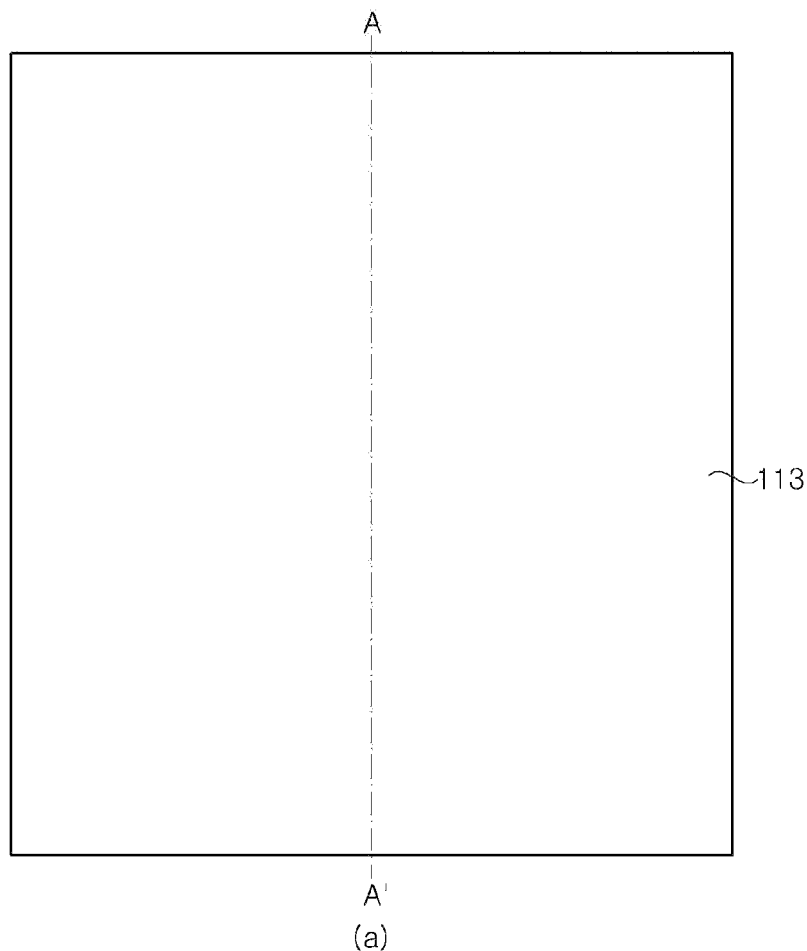
FIG. 21 is a plan view (a) and a cross-sectional view (b) illustrating a method of manufacturing a light emitting element according to another exemplary embodiment of the present disclosure.
Figure 21:

Referring to FIG. 21, a first conductivity type semiconductor layer 111, an active layer 112, and a second conductivity type semiconductor layer 113 are sequentially formed on an upper surface of a substrate 100. The substrate 100 may be selected from any substrates that allow the light emitting structure 110 to be grown thereon. For example, the substrate 100 may include a sapphire substrate, a silicon carbide substrate, a silicon substrate, a gallium nitride substrate, an aluminum nitride substrate, and the like. The first conductivity type semiconductor layer 111, the active layer 112, and the second conductivity type semiconductor layer 113 may be grown on the substrate by metal organic chemical vapor deposition (MOCVD) or molecular beam epitaxy (MBE).

Figure 22:
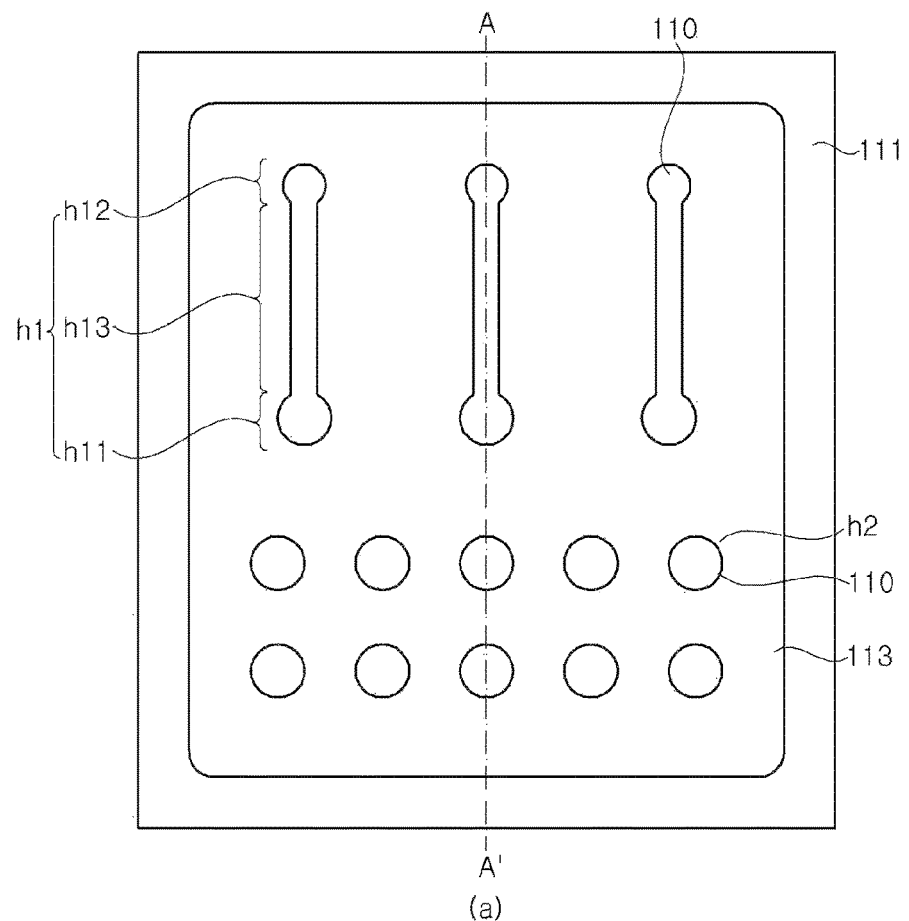
FIG. 22 is a plan view (a) and a cross-sectional view (b) illustrating a method of manufacturing a light emitting element according to a further exemplary embodiment of the present disclosure.
Figure 22:
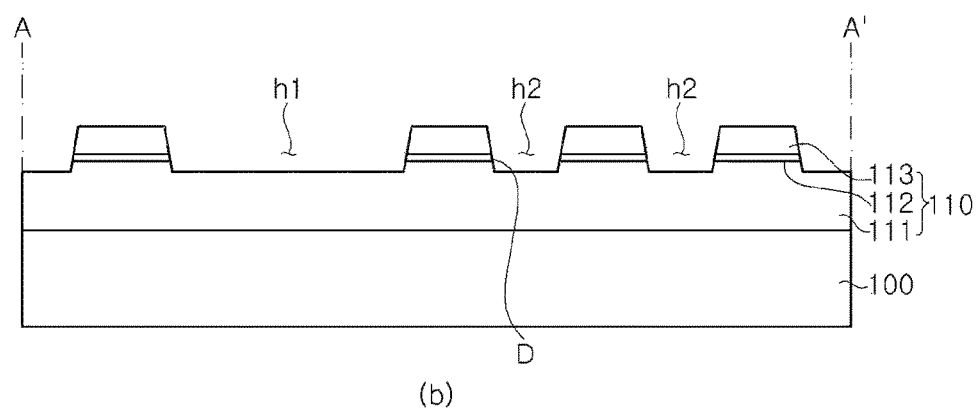

Referring to FIG. 22, a hole (h) may be formed in the light emitting structure 110. Specifically, the hole (h) may be formed by patterning the second conductivity type semiconductor layer 113 and the active layer 112 so as to expose the first conductivity type semiconductor layer 111. The side surface of the hole (h) may be inclined by a photoresist reflow process or the like. In this method, the second conductivity type semiconductor layer 113 and the active layer 112 may be subjected to patterning such that the first region h11 of the first hole h1 is formed to be larger than the second region h12 thereof.

Figure 23:
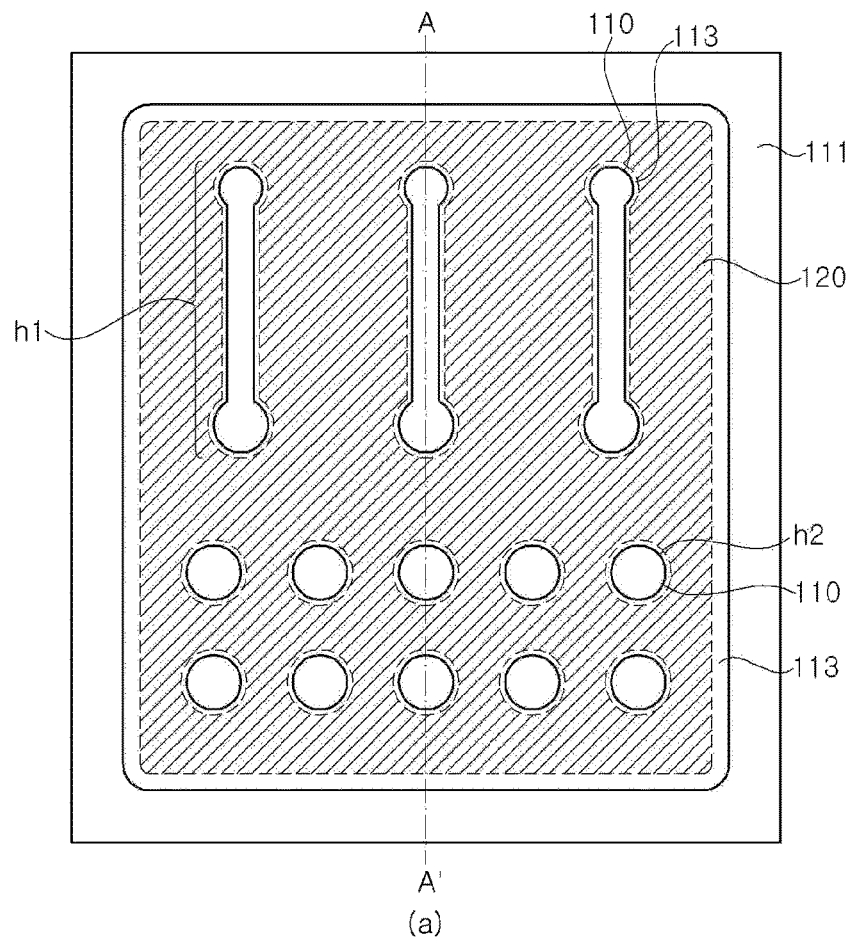
FIG. 23 is a plan view (a) and a cross-sectional view (b) illustrating a method of manufacturing a light emitting element according to yet another exemplary embodiment of the present disclosure.
Figure 23:
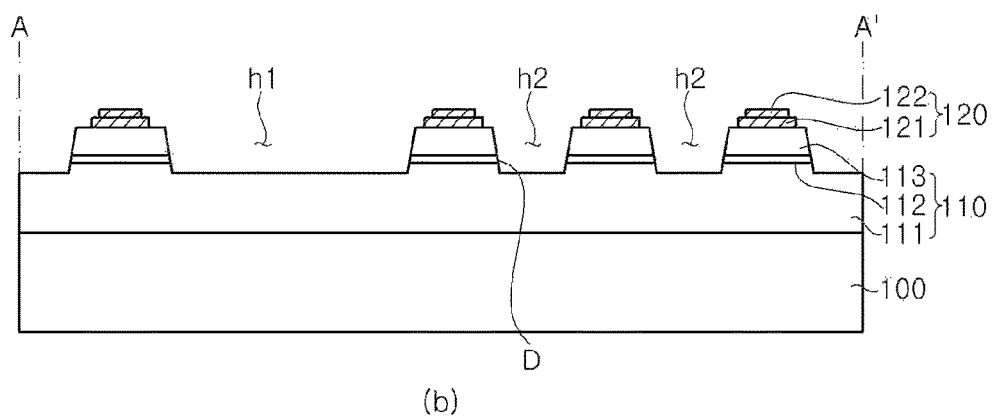

Referring to FIG. 23, a second electrode 120 may be formed on an upper surface of the second conductivity type semiconductor layer 113. Specifically, a reflective metal layer 121 and a barrier metal layer 122 may be formed on the upper surface of the second conductivity type semiconductor layer 113. The reflective metal layer 121 and the barrier metal layer 122 may be formed by e-beam deposition, vacuum deposition, sputtering, metal organic chemical vapor deposition (MOCVD), or the like. Specifically, a pattern of the reflective metal layer 121 may be formed and then the barrier metal layer 122 may be formed thereon.

Figure 24:
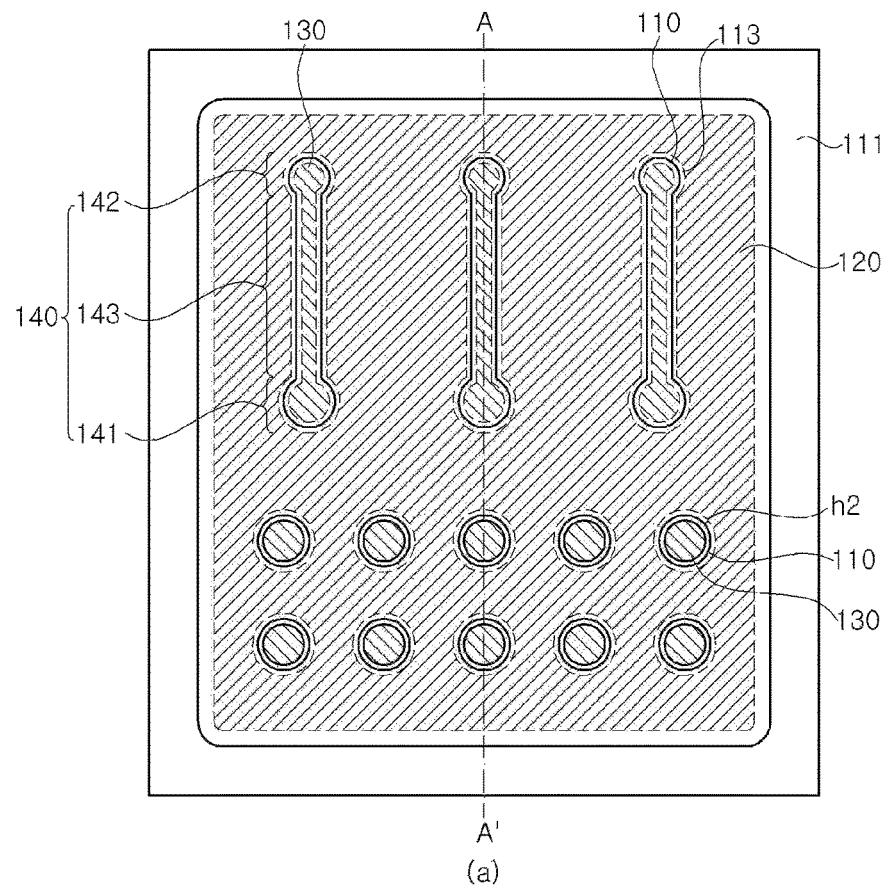
FIG. 24 is a plan view (a) and a cross-sectional view (b) illustrating a method of manufacturing a light emitting element according to yet another exemplary embodiment of the present disclosure.
Figure 24:
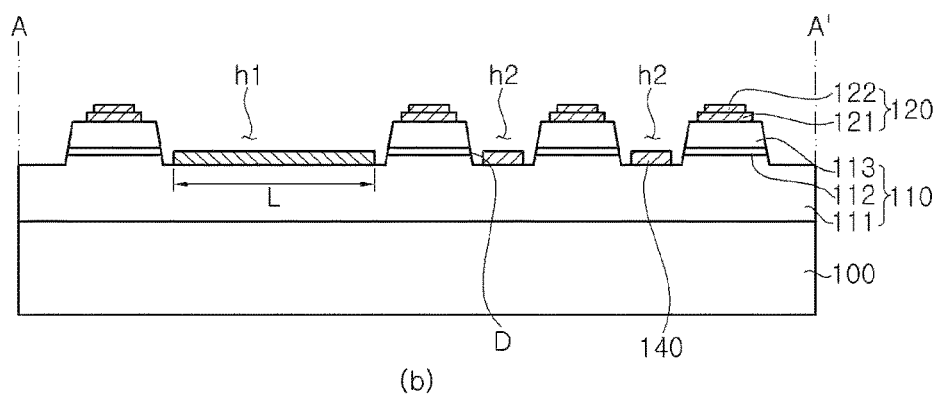

Referring to FIG. 24, a first electrode 140 may be formed in each hole (h). The first electrode 140 may be formed corresponding to the shape of the hole (h) using a mask. The first electrode 140 may be formed by e-beam deposition, vacuum deposition, sputtering, metal organic chemical vapor deposition (MOCVD), or the like.

Figure 25:
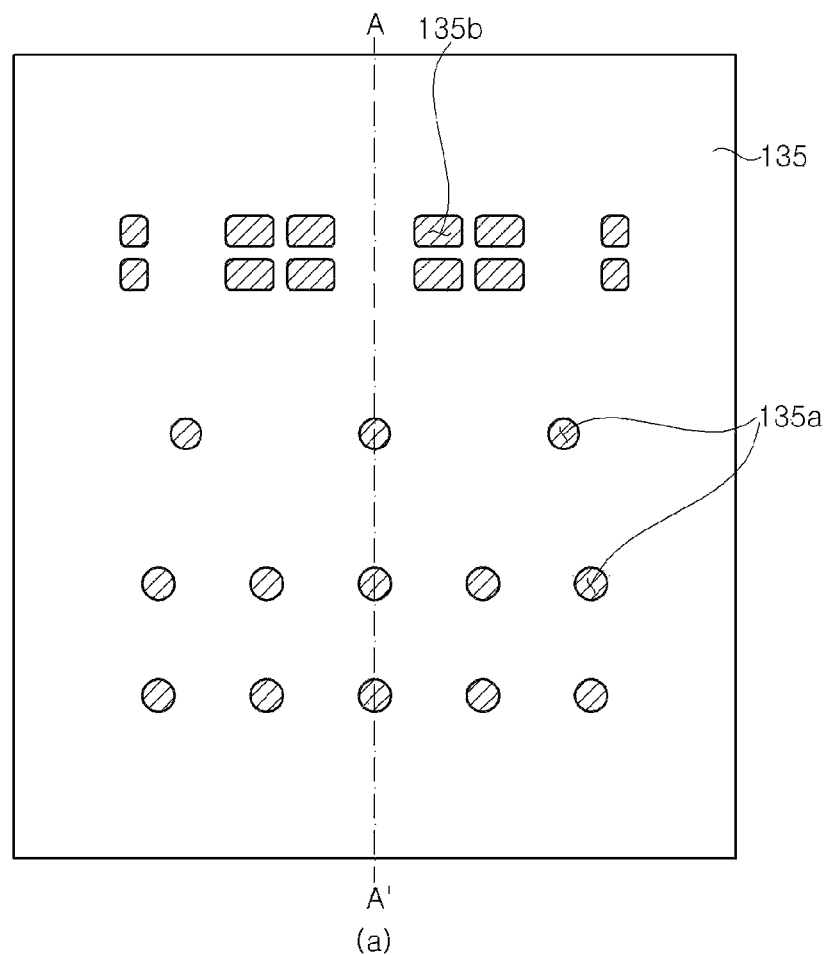
FIG. 25 is a plan view (a) and a cross-sectional view (b) illustrating a method of manufacturing a light emitting element according to yet another exemplary embodiment of the present disclosure.
Figure 25:
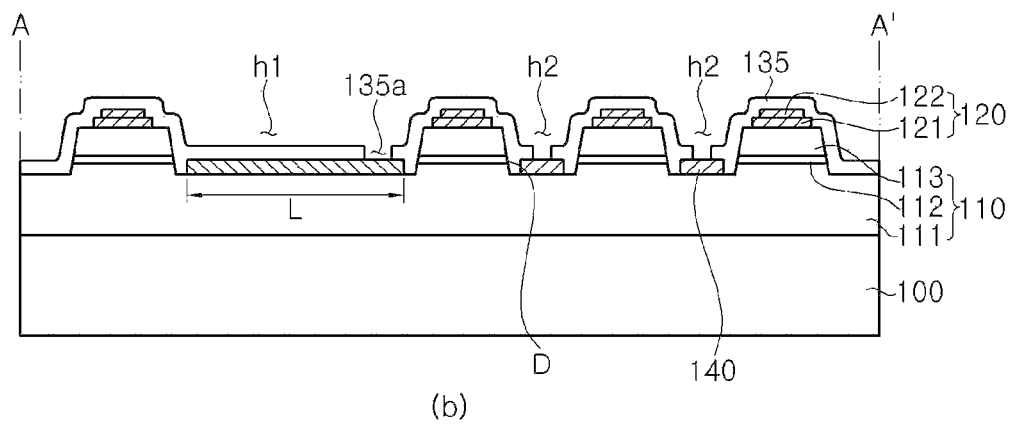

Referring to FIG. 25, an insulation layer 135 may be formed on the upper and side surfaces of the first electrode 140 and the upper and side surfaces of the second electrode 120. The insulation layer 135 may be composed of a single layer or multiple layers and may be formed by chemical vapor deposition (CVD) and the like. First openings 135a and Second openings 135b may be formed using a mask, or by etching after deposition of the insulation layer 135, without being limited thereto.

Figure 26:
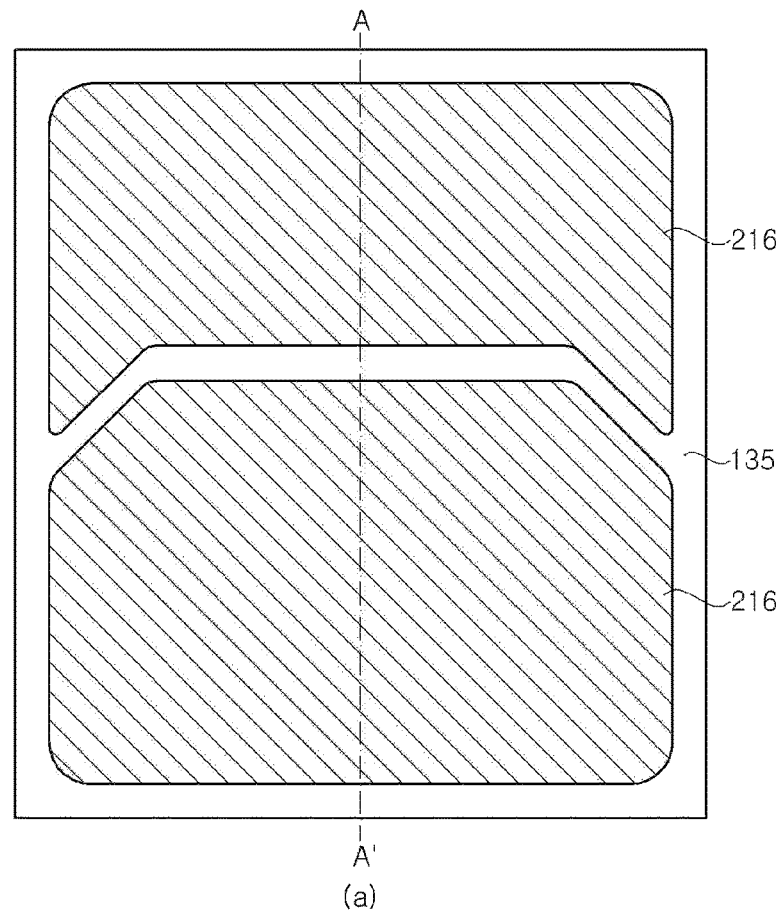
FIG. 26 is a plan view (a) and a cross-sectional view (b) illustrating a method of manufacturing a light emitting element according to yet another exemplary embodiment of the present disclosure.
Figure 26:
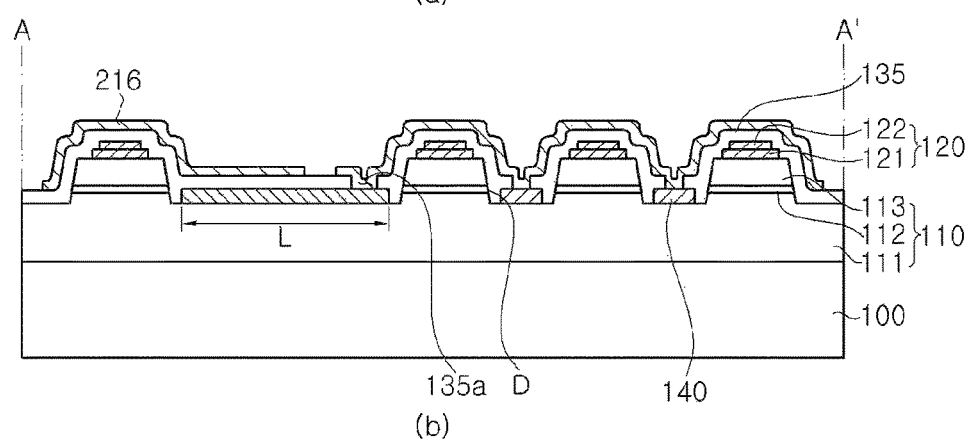
Figure 27:
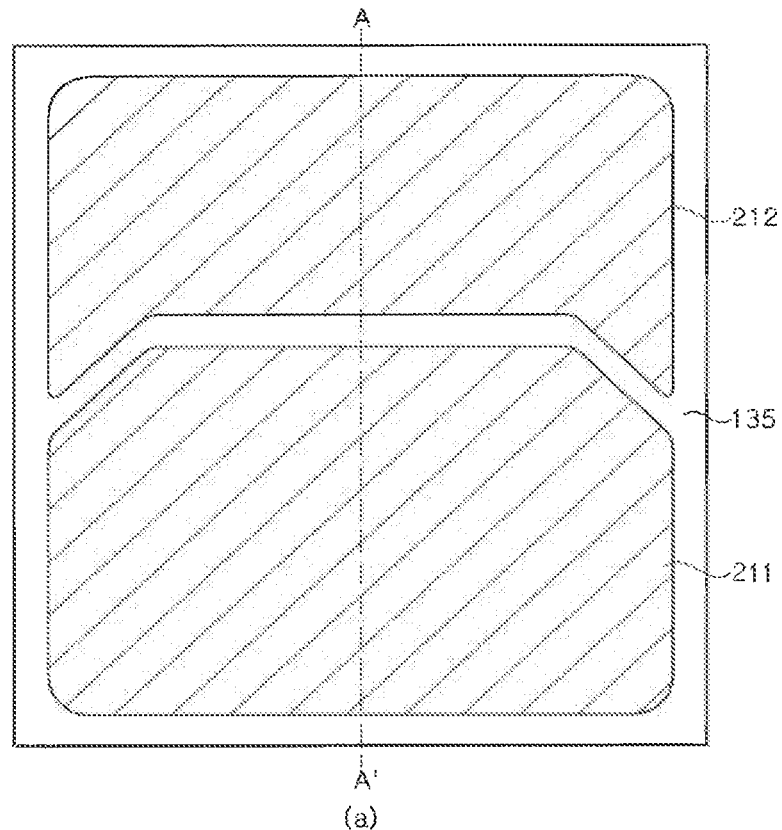
FIG. 27 is a plan view (a) and a cross-sectional view (b) illustrating a method of manufacturing a light emitting element according to yet another exemplary embodiment of the present disclosure.
Figure 27:
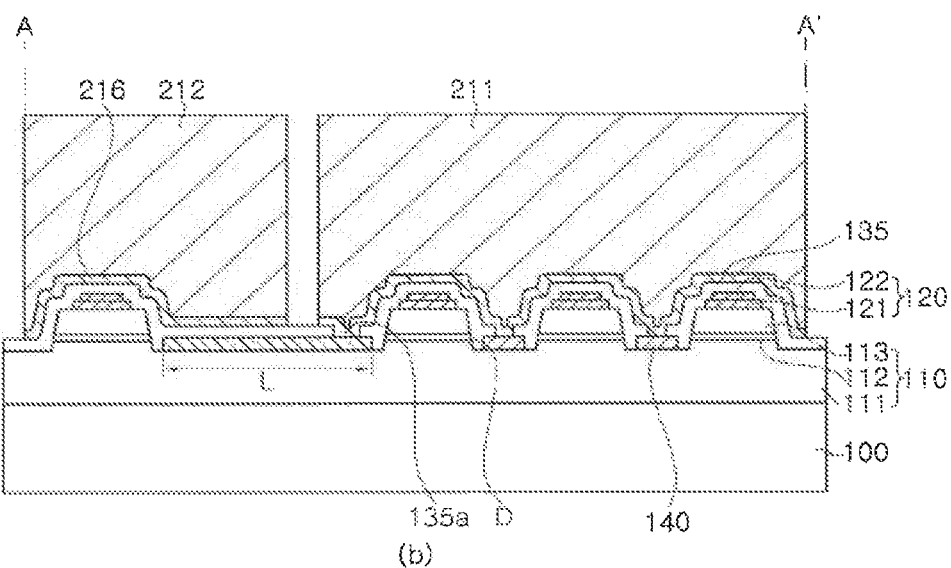

Referring to FIG. 26 and FIG. 27, seed metals 216 and first and second metal bulks 211, 212 may be formed on the insulation layer 135. A mask is formed on an upper surface of the insulation layer 135 so as to cover a portion of the upper surface of the insulation layer 135 corresponding to a region in which the insulating portion 213 will be formed, and to open regions in which the seed metals 216 and the first and second metal bulks 211, 212 will be formed. Specifically, since an upper portion of the first region h11 of the first hole h1 is open through the mask, the location of the mask may be designated to allow the seed metal 216 and the first metal bulk 211 to be formed above the first region h11. Next, the seed metals 216 are formed in the open regions of the mask by sputtering, and the first metal bulk 211 and the second metal bulk 212 are formed on the seed metals 216 by plating. Then, the mask is removed by etching, thereby providing the seed metals 216 and the first and second metal bulks 211, 212 in desired shapes.

Alternatively, the first and second metal bulks 211, 212 may be formed by screen printing as follows. That is, a UBM layer is formed on at least part of the first opening 135a and the second opening 135b by deposition such as sputtering and patterning, or by deposition and lift-off. The UBM layer may be formed on regions in which the first and second metal bulks 211, 212 will be formed, and may include a Ti or TiW layer and a single layer or combined layer of Cu, Ni or Au. For example, the UBM layer may have a Ti/Cu stack structure. Thereafter, a mask is formed so as to cover a portion corresponding to a region in which the insulating portion 213 will be formed and to open regions in which the first and second metal bulks 211, 212 will be formed. Even in this case, an upper portion of the first region h11 of the first hole h1 is open through the mask to allow the first metal bulk 211 to be formed on the upper portion of the first region h11. Next, a material, such as Ag pastes, Au pastes, Cu pastes, and the like, is supplied to the open regions through screen printing, and is then cured. Thereafter, the first and second metal bulks 211, 212 can be formed by removing the mask through etching.

Figure 28:
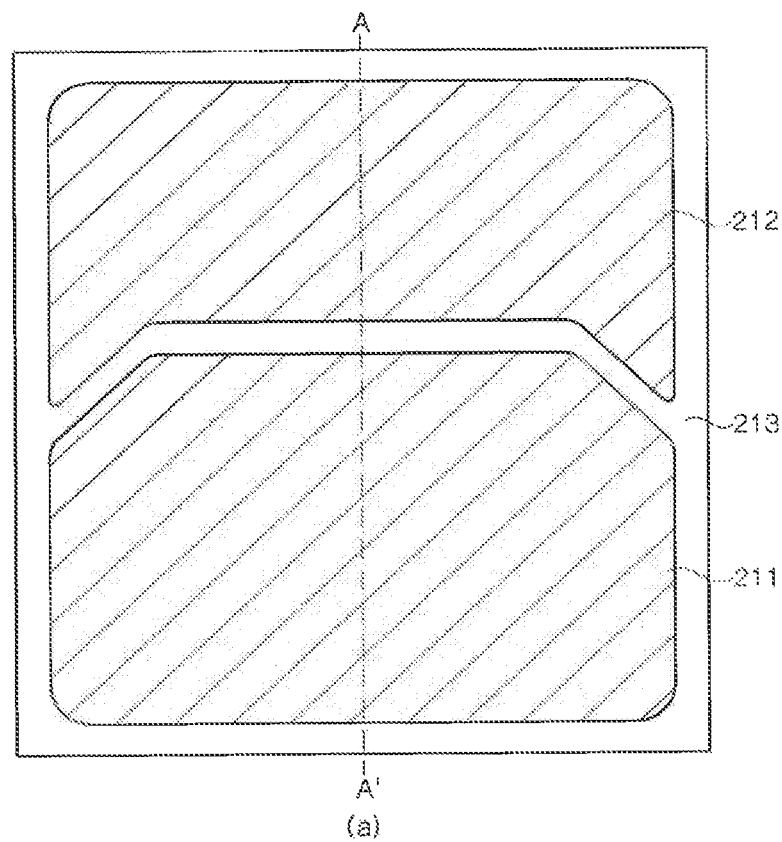
FIG. 28 is a plan view (a) and a cross-sectional view (b) illustrating a method of manufacturing a light emitting element according to yet another exemplary embodiment of the present disclosure.
Figure 28:
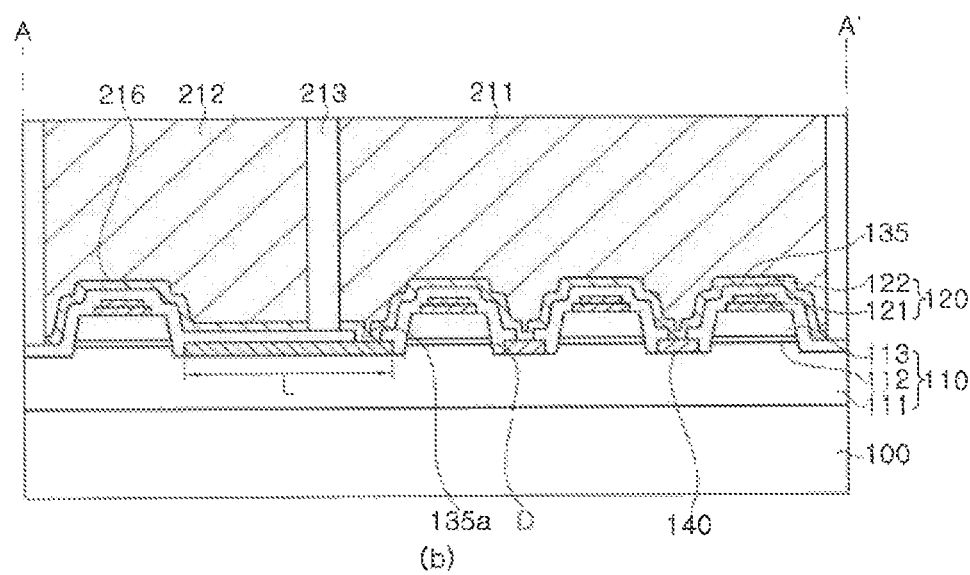

Referring to FIG. 28, an insulating portion 213 may be formed between the first metal bulk 211 and the second metal bulk 212. The insulating portion 213 may be formed by printing or coating. The insulating portion 213 may be coated to cover the upper surface of the first metal bulk 211 and the upper surface of the second metal bulk 212, and the upper surface of the insulating portion 213 may be flattened by lapping, chemical vapor deposition (CVD), and the like so as to expose the first and second metal bulks 211, 212.

Figure 29:
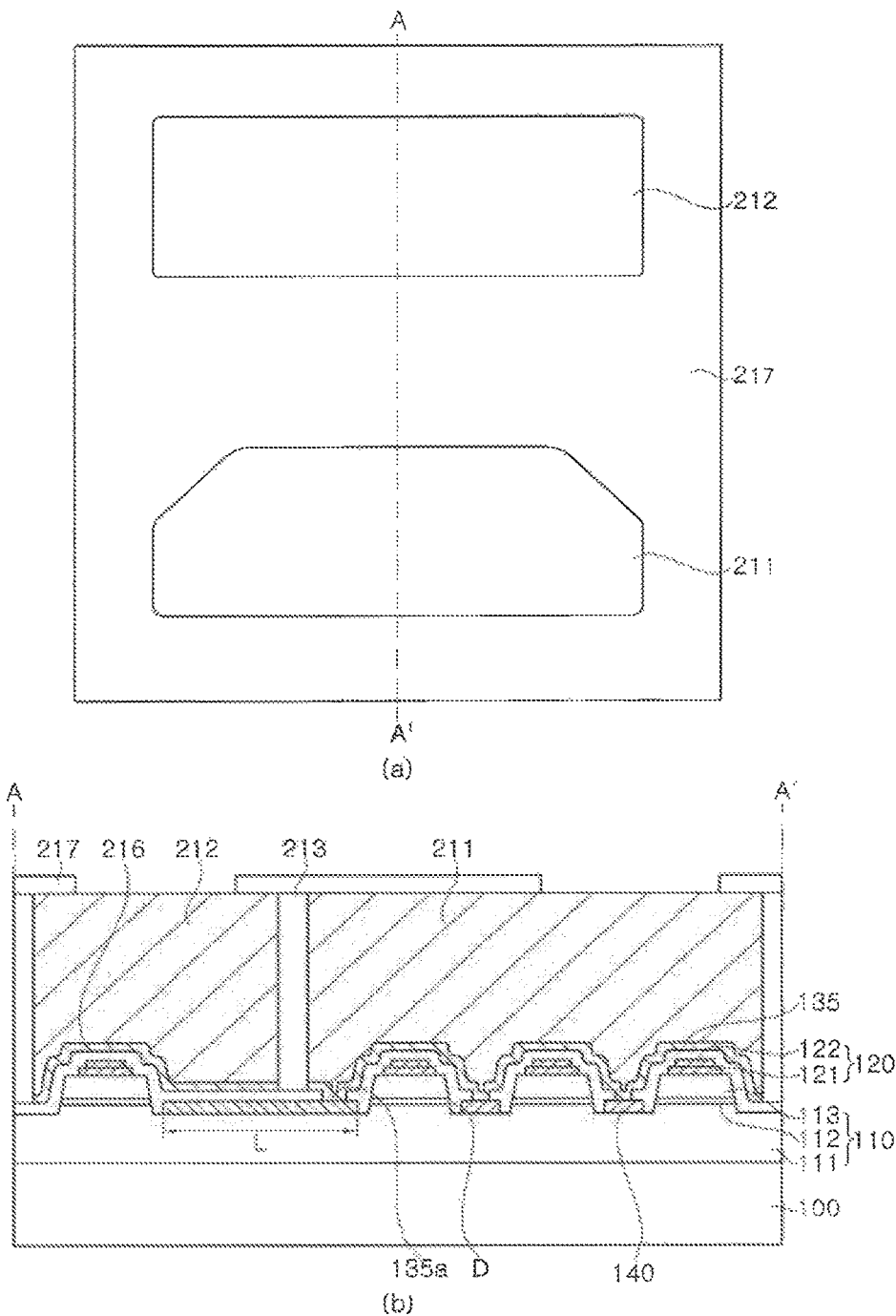
FIG. 29 is a plan view (a) and a cross-sectional view (b) illustrating a method of manufacturing a light emitting element according to yet another exemplary embodiment of the present disclosure.
Figure 30:
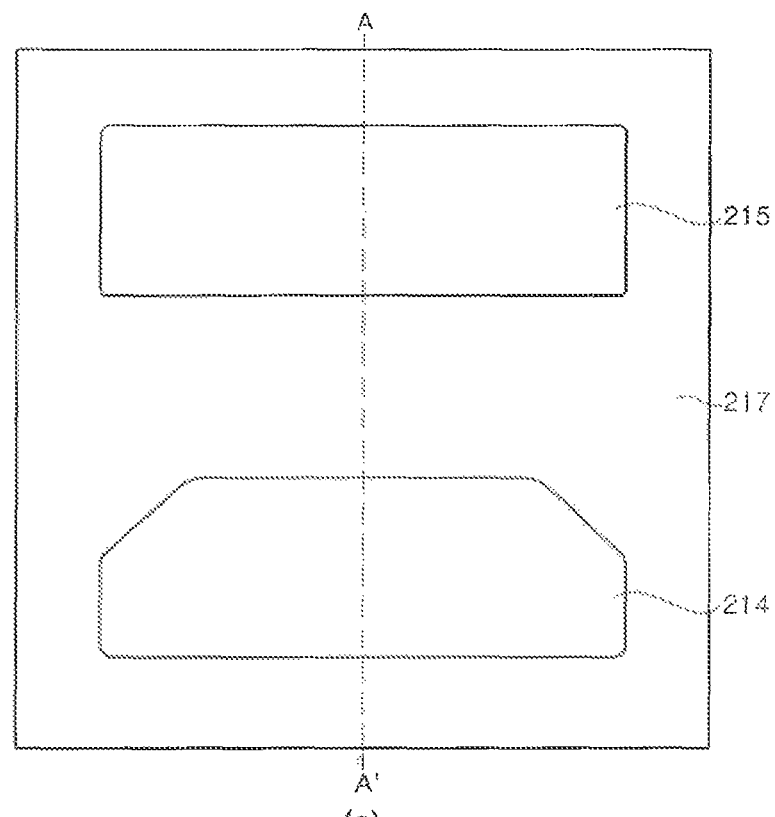
FIG. 30 is a plan view (a) and a cross-sectional view (b) illustrating a method of manufacturing a light emitting element according to yet another exemplary embodiment of the present disclosure.
Figure 30:
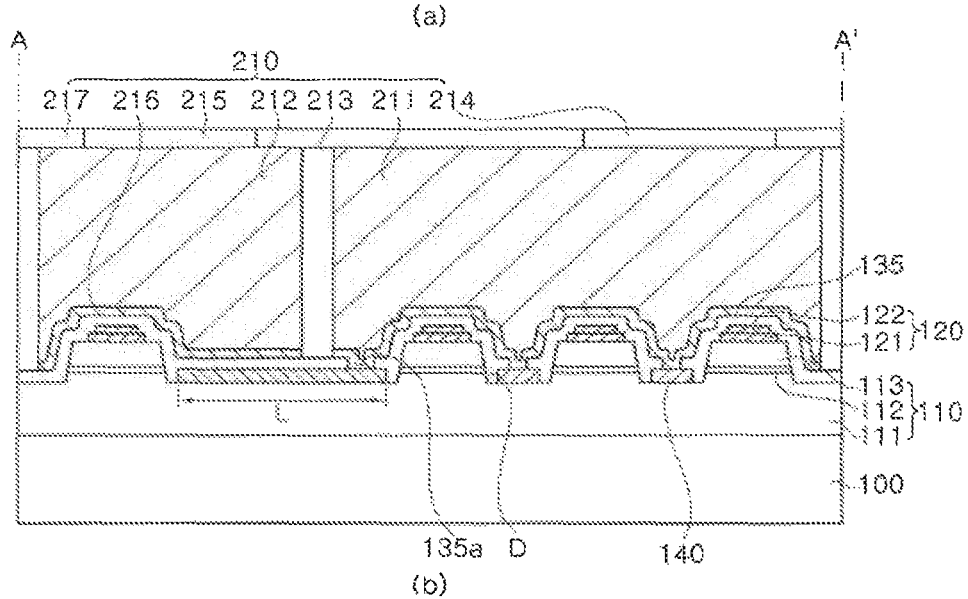

For the structure wherein the light emitting element further includes the insulating support 217, the first pad 214 and the second pad 215, FIG. 29 and FIG. 30 show a method of forming the insulating support 217, the first pad 214 and the second pad 215. Referring to FIG. 29, the insulating support 217 may be formed on the upper surface of the insulating portion 213 by printing or coating, and a mask may be disposed thereon to open some regions of the upper surface of the first metal bulk 211 and some regions of the upper surface of the second metal bulk 212. Referring to FIG. 30, the first pad 214 and the second pad 215 may be formed on the upper surface of the first metal bulk 211 and the upper surface of the second metal bulk 212 by e-beam deposition, vacuum deposition, sputtering or metal organic chemical vapor deposition (MOCVD). Furthermore, the first pad 214 and the second pad 215 may be formed only in an open region of the upper surface of the first metal bulk 211 and in an open region of the upper surface of the second metal bulk 212, which are open by the mask, respectively.

The substrate 100 may be removed from the light emitting structure 110 by a technique well-known in the art, such as laser lift-off, after formation of the support structure 210.

Figure 31:
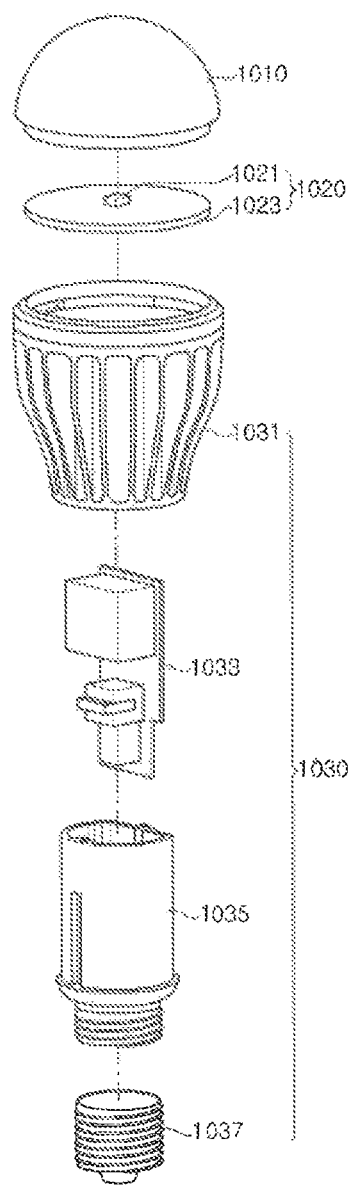
FIG. 31 is an exploded perspective view of one embodiment of a lighting apparatus to which a light emitting element according to one exemplary embodiment of the present disclosure is applied.

FIG. 31 is an exploded perspective view of one embodiment of a lighting apparatus to which a light emitting element according to one exemplary embodiment is applied.

Referring to FIG. 31, the lighting apparatus according to this embodiment includes a diffusive cover 1010, a light emitting module 1020, and a body 1030. The body 1030 may receive the light emitting module 1020 and the diffusive cover 1010 may be disposed on the body 1030 to cover an upper side of the light emitting module 1020.

The body 1030 may have any shape so long as the body can supply electric power to the light emitting module 1020 while receiving and supporting the light emitting module 1020. For example, as shown in the drawing, the body 1030 may include a body case 1031, a power supply 1033, a power supply case 1035, and a power source connection 1037.

The power supply 1033 is received in the power supply case 1035 to be electrically connected to the light emitting module 1020, and may include at least one IC chip. The IC chip may regulate, change or control electric power supplied to the light emitting module 1020. The power supply case 1035 may receive and support the power supply 1033, and the power supply case 1035 having the power supply 1033 secured therein may be disposed within the body case 1031.

The power source connection 1037 is disposed at a lower end of the power supply case 1035 and is coupled thereto. Accordingly, the power source connection 1037 is electrically connected to the power supply 1033 within the power supply case 1035 and can serve as a passage through which power can be supplied from an external power source to the power supply 1033.

The light emitting module 1020 includes a substrate 1023 and a light emitting element 1021 disposed on the substrate 1023. The light emitting module 1020 may be disposed at an upper portion of the body case 1031 and electrically connected to the power supply 1033.

As the substrate 1023, any substrate capable of supporting the light emitting element 1021 may be used without limitation. For example, the substrate 1023 may include a printed circuit board having interconnects formed thereon. The substrate 1023 may have a shape corresponding to a securing portion formed at the upper portion of the body case 1031 so as to be stably secured to the body case 1031. The light emitting element 1021 may include at least one of the light emitting elements according to the exemplary embodiments described above.

The diffusive cover 1010 is disposed on the light emitting element 1021 and may be secured to the body case 1031 to cover the light emitting element 1021. The diffusive cover 1010 may be formed of a light-transmitting material and light orientation of the lighting apparatus may be adjusted through regulation of the shape and optical transmissivity of the diffusive cover 1010. Thus, the diffusive cover 1010 may be modified in various shapes depending on usage and applications of the lighting apparatus.

Figure 32:
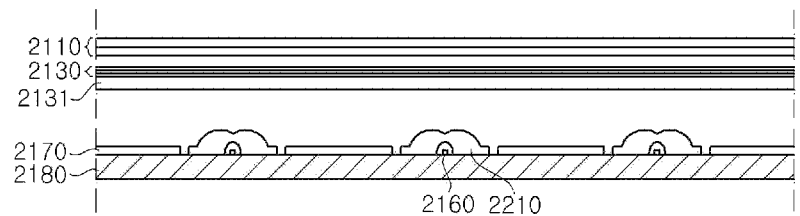
FIG. 32 is a cross-sectional view of one embodiment of a display to which a light emitting element according to one exemplary embodiment of the present disclosure is applied.

FIG. 32 is a cross-sectional view of one embodiment of a display apparatus to which a light emitting element according to one exemplary embodiment of the present disclosure is applied.

The display apparatus according to this embodiment includes a display panel 2110, a backlight unit supplying light to the display panel 2110, and a panel guide supporting a lower edge of the display panel 2110.

The display panel 2110 is not particularly limited and may be, for example, a liquid crystal panel including a liquid crystal layer. Gate driving PCBs may be further disposed at the periphery of the display panel 2110 to supply driving signals to a gate line. Here, the gate driving PCBs may be formed on a thin film transistor substrate instead of being formed on separate PCBs.

The backlight unit includes a light source module which includes at least one substrate and a plurality of light emitting elements 2160. The backlight unit may further include a bottom cover 2180, a reflective sheet 2170, a diffusive plate 2131, and optical sheets 2130.

The bottom cover 2180 may be open at an upper side thereof to receive the substrate, the light emitting elements 2160, the reflective sheet 2170, the diffusive plate 2131, and the optical sheets 2130. In addition, the bottom cover 2180 may be coupled to the panel guide. The substrate may be disposed under the reflective sheet 2170 to be surrounded by the reflective sheet 2170. Alternatively, when a reflective material is coated on a surface thereof, the substrate may be disposed on the reflective sheet 2170. Further, a plurality of substrates may be arranged parallel to one another, without being limited thereto. However, it should be understood that the backlight unit includes a single substrate.

The light emitting elements 2160 may include at least one of the light emitting elements according to the exemplary embodiments described above. The light emitting elements 2160 may be regularly arranged in a predetermined pattern on the substrate. In addition, a lens 2210 may be disposed on each of the light emitting elements 2160 to improve uniformity of light emitted from the plurality of light emitting elements 2160.

The diffusive plate 2131 and the optical sheets 2130 are disposed above the light emitting element 2160. Light emitted from the light emitting elements 2160 may be supplied in the form of sheet light to the display panel 2110 through the diffusive plate 2131 and the optical sheets 2130.

In this way, the light emitting elements according to the exemplary embodiments may be applied to direct type displays like the display apparatus according to this embodiment.

Figure 33:
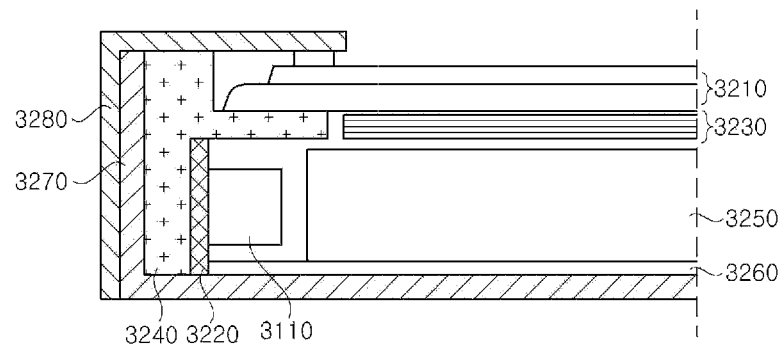
FIG. 33 is a cross-sectional view of another embodiment of a display to which a light emitting element according to one exemplary embodiment of the present disclosure is applied.

FIG. 33 is a cross-sectional view of another embodiment of the display apparatus to which a light emitting element according to one exemplary embodiment of the present disclosure is applied.

The display apparatus according to this embodiment includes a display panel 3210 on which an image is displayed, and a backlight unit disposed at a rear side of the display panel 3210 and emitting light thereto. Further, the display apparatus includes a frame supporting the display panel 3210 and receiving the backlight unit, and covers 3240, 3280 surrounding the display panel 3210.

The display panel 3210 is not particularly limited and may be, for example, a liquid crystal panel including a liquid crystal layer. A gate driving PCB may be further disposed at the periphery of the display panel 3210 to supply driving signals to a gate line. Here, the gate driving PCB may be formed on a thin film transistor substrate instead of being formed on a separate PCB. The display panel 3210 is secured by the covers 3240, 3280 disposed at upper and lower sides thereof, and the cover 3280 disposed at the lower side of the display panel 3210 may be coupled to the backlight unit.

The backlight unit supplying light to the display panel 3210 includes a lower cover 3270 partially open at an upper side thereof, a light source module disposed at one side inside the lower cover 3270, and a light guide plate 3250 disposed parallel to the light source module and converting spot light into sheet light. In addition, the backlight unit according to this embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting elements 3110 arranged at constant intervals on one surface of the substrate 3220. As the substrate 3220, any substrate capable of supporting the light emitting elements 3110 and being electrically connected thereto may be used without limitation. For example, the substrate 3220 may include a printed circuit board. The light emitting elements 3110 may include at least one of the light emitting elements according to the exemplary embodiments described above. Light emitted from the light source module enters the light guide plate 3250 and is supplied to the display panel 3210 through the optical sheets 3230. The light guide plate 3250 and the optical sheets 3230 convert spot light emitted from the light emitting elements 3110 into sheet light.

In this way, the light emitting elements according to the exemplary embodiments may be applied to edge type displays like the display apparatus according to this exemplary embodiment.

Figure 34:
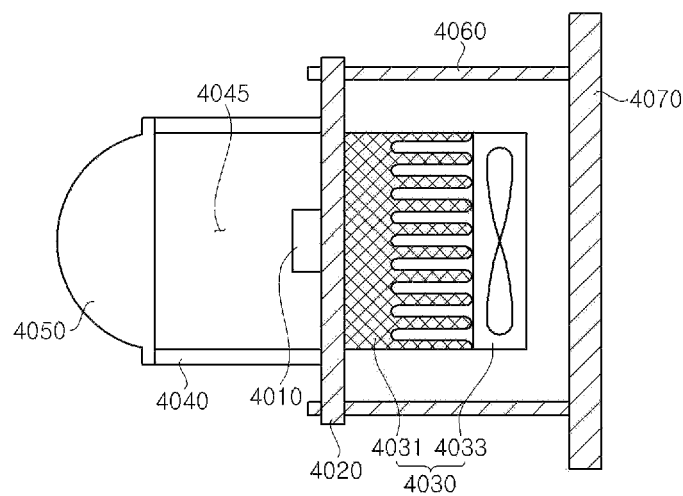
FIG. 34 is a cross-sectional view of a headlight to which a light emitting element according to one exemplary embodiment of the present disclosure is applied.

FIG. 34 is a cross-sectional view of a headlight to which a light emitting element according to one exemplary embodiment of the present disclosure is applied.

Referring to FIG. 34, the headlight according to this embodiment includes a lamp body 4070, a substrate 4020, a light emitting element 4010, and a cover lens 4050. The headlight may further include a heat dissipation unit 4030, a support rack 4060, and a connection member 4040.

The substrate 4020 is secured by the support rack 4060 and is disposed above the lamp body 4070. As the substrate 4020, any member capable of supporting the light emitting element 4010 may be used without limitation. For example, the substrate 4020 may include a substrate having a conductive pattern, such as a printed circuit board. The light emitting element 4010 is disposed on the substrate 4020 and may be supported and secured by the substrate 4020. In addition, the light emitting element 4010 may be electrically connected to an external power source through the conductive pattern of the substrate 4020. Further, the light emitting element 4010 may include at least one of the light emitting elements according to the exemplary embodiments described above.

The cover lens 4050 is disposed on a path of light emitted from the light emitting element 4010. For example, as shown in the drawing, the cover lens 4050 may be spaced apart from the light emitting element 4010 by the connection member 4040 and may be disposed in a direction of supplying light emitted from the light emitting element 4010. By the cover lens 4050, an orientation angle and/or a color of light emitted by the headlight can be adjusted. On the other hand, the connection member 4040 is disposed to secure the cover lens 4050 to the substrate 4020 while surrounding the light emitting element 4010, and thus can act as a light guide that provides a luminous path 4045. The connection member 4040 may be formed of a light reflective material or coated therewith. On the other hand, the heat dissipation unit 4030 may include heat dissipation fins 4031 and/or a heat dissipation fan 4033 to dissipate heat generated upon operation of the light emitting element 4010.

In this way, the light emitting elements according to the exemplary embodiment may be applied to headlights, particularly, headlights for vehicles, like the headlight according to this embodiment.

What is claimed is:

1. A light emitting element comprising:
a light emitting structure comprising a first conductivity type semiconductor layer having a first sidewall and a second opposite sidewall to the first sidewall and comprising a contact region formed on a surface of the first conductivity type semiconductor and between the first sidewall and the second sidewall to contact the first conductivity type semiconductor layer, and a mesa comprising an active layer disposed on the surface of the first conductivity type semiconductor layer and a second conductivity type semiconductor layer disposed on a surface of the active layer, the first conductivity type semiconductor layer continuously extending between the first sidewall and the second sidewall;
a second electrode disposed on a surface of the second conductivity type semiconductor layer and electrically connected to the second conductivity type semiconductor layer;
a first insulation layer disposed on a surface of the light emitting structure and comprising an opening exposing the contact region;
an electrode cover layer disposed on a surface of the first insulation layer and adjoining the surface of the second electrode while being separated from the first electrode;
a first electrode disposed on the surface of the first insulation layer and adjoining—the contact region through the opening of the first insulation layer, the first electrode electrically connected to the first conductivity type semiconductor layer in the contact region;
a second insulation layer disposed on the surfaces of the first electrode and the electrode cover layer and comprising openings exposing the first electrode and the second electrode, respectively; and
a support structure comprising a first metal bulk and a second metal bulk disposed on the surface of the second insulation layer to be separated from each other and electrically connected to the first electrode and the second electrode through the openings of the second insulation layer, respectively, and an insulating portion disposed on side surfaces of the first metal bulk the second metal bulk,
wherein the mesa comprises a main body and a plurality of protrusions protruding from the main body, and the contact region is disposed between the protrusions and partially overlaps the second metal bulk in an upward-downward direction.

2. The light emitting element according to claim 1, wherein the light emitting element includes additional contact regions and the plurality of protrusions include protrusions disposed between two contact regions have greater widths in a short axis direction than other protrusions disposed between a side surface of the light emitting element and one contact region.

3. The light emitting element according to claim 1, wherein the second insulation layer is partially disposed between the second metal bulk and the first electrode and insulates the first electrode from the second metal bulk.

4. The light emitting element according to claim 1, wherein one side of the electrode cover layer is disposed along one side of the light emitting element, the other side of the electrode cover layer opposite the one side of the electrode cover layer faces one side of the first electrode and a portion of the electrode cover layer is disposed on a side surface of the mesa.

5. The light emitting element according to claim 1, further comprising:
a first pad and a second pad disposed on surfaces of the first and second metal bulks, respectively,
wherein a distance between the first pad and the second pad is greater than the distance between the first metal bulk and the second metal bulk.

6. The light emitting element according to claim 1, further comprising:
an insulating layer disposed on an upper or side surface of the light emitting structure.

7. The light emitting element according to claim 2, wherein the main body has a width of 87 μm to 90 μm in the short axis direction.

8. The light emitting element according to claim 4, wherein the electrode cover layer is non-overlapping with the contact region and the first electrode in the upward-downward direction, and a side surface of the electrode cover layer comprises an indented portion and a protruded portion that are formed to surround a portion of the contact region.

9. The light emitting element according to claim 8, wherein a portion of the second insulation layer is disposed in a separation space between the electrode cover layer and the first electrode, the separation space non-overlapping with the contact region in the upward-downward direction.

10. A light emitting element comprising:
- a light emitting structure comprising a first conductivity type semiconductor layer, a second conductivity type semiconductor layer disposed on a surface of the first conductivity type semiconductor layer, an active layer interposed between the first conductivity type semiconductor layer and the second conductivity type semiconductor layer, and a plurality of holes formed through the second conductivity type semiconductor layer and the active layer to expose the first conductivity type semiconductor layer, the second conductive type semiconductor layer and the active layer structured to provide a mesa and the first conductivity type semiconductor layer exposed by the second conductive type semiconductor layer and the active layer structured to provide a contact region;
- a first electrode disposed in each of the holes and electrically connected to the first conductivity type semiconductor layer;
- a second electrode insulated from the first electrode, the second electrode being disposed on a surface of the second conductivity type semiconductor layer and electrically connected to the second conductivity type semiconductor layer;
- an insulation layer disposed on surfaces of the first electrode and on surfaces of the second electrode, the insulation layer having openings exposing the first electrode and the second electrode, respectively; and
- a support structure comprising a first metal bulk and a second metal bulk disposed on surfaces of the insulation layer to be separated from each other and electrically connected to the first electrode and the second electrode through the openings, respectively, and an insulating portion disposed on a side surface of the first metal bulk and a side surface of the second metal bulk,
- wherein the holes comprise a first hole, the first hole comprising a first region, a second region, and a connection portion connecting the first region to the second region, the first region being disposed on the first metal bulk, the second region being disposed on the second metal bulk,
- wherein the mesa comprises a main body and a plurality of protrusions protruding from the main body, and the contact region is disposed between the protrusions and partially overlaps the second metal bulk in an upward-downward direction.

11. The light emitting element according to claim 10, wherein the first electrode is separated from a side surface of the hole and is formed corresponding to a shape of the hole.

12. The light emitting element according to claim 10, wherein the holes further comprise at least one second hole disposed on the first metal bulk.

13. The light emitting element according to claim 11, wherein the first electrode is separated from the side surface of the hole by a constant distance.

14. The light emitting element according to claim 11, wherein the first region is larger than the second region.

15. The light emitting element according to claim 14, wherein the first and second regions have a circular shape.

16. The light emitting element according to claim 12, wherein a distance between the second hole and the second metal bulk is larger than the distance between the first region and the second metal bulk.

17. The light emitting element according to claim 12, wherein the second hole has a circular shape.

* * * * *